US012790540B2

(12) United States Patent
Yang et al.

(10) Patent No.: US 12,790,540 B2
(45) Date of Patent: Nov. 10, 2026

(54) PHOTOELECTRIC DEVICES

(71) Applicant: TCL TECHNOLOGY GROUP CORPORATION, Huizhou (CN)

(72) Inventors: Yixing Yang, Huizhou (CN); Likuan Zhou, Huizhou (CN); Tianfeng Wang, Huizhou (CN)

(73) Assignee: TCL TECHNOLOGY GROUP CORPORATION, Huizhou (CN)

(*) Notice: Subject to any disclaimer, the term of this patent is extended or adjusted under 35 U.S.C. 154(b) by 470 days.

(21) Appl. No.: 18/270,712

(22) PCT Filed: Dec. 29, 2021

(86) PCT No.: PCT/CN2021/142734
§ 371 (c)(1),
(2) Date: Jun. 30, 2023

(87) PCT Pub. No.: WO2022/143831
PCT Pub. Date: Jul. 7, 2022

(65) Prior Publication Data
US 2024/0040816 A1 Feb. 1, 2024

(30) Foreign Application Priority Data
Dec. 31, 2020 (CN) ........................ 202011643638.9

(51) Int. Cl.
*H10K 85/00* (2023.01)
*C09K 11/56* (2006.01)
(Continued)

(52) U.S. Cl.
CPC .......... *C09K 11/565* (2013.01); *H10K 50/115* (2023.02); *H10K 50/15* (2023.02);
(Continued)

(58) Field of Classification Search
CPC ... C09K 11/565; C09K 11/025; C09K 11/883; H10K 50/115; H10K 50/15; H10K 50/16;
(Continued)

(56) References Cited

U.S. PATENT DOCUMENTS 7,976,959 B2 7/2011 Horiba et al.
11,171,299 B2 11/2021 Seo et al.
(Continued)

FOREIGN PATENT DOCUMENTS

CN 101087013 A 12/2007
CN 101546812 A 9/2009
(Continued)

OTHER PUBLICATIONS

International Search Report dated Mar. 16, 2022; International Application No. PCT/CN2021/142734; 2 pages (English Translation).
(Continued)

*Primary Examiner* — Sheikh Maruf
(74) *Attorney, Agent, or Firm* — FOLEY & LARDNER LLP

(57) ABSTRACT

A photoelectric device, which includes an anode, a first hole injection layer, a hole transport layer, a quantum dot light-emitting layer, and a cathode arranged in sequence, and an absolute value of a difference between a maximum energy level of valence band of a hole transport material in the hole transport layer and a work function of a first hole injection material in the first hole injection layer is smaller than or equal to 0.2 eV.

19 Claims, 11 Drawing Sheets

(51) Int. Cl.

| | |
|---|---|
| ***H10K 50/115*** | (2023.01) |
| ***H10K 50/15*** | (2023.01) |
| ***H10K 50/16*** | (2023.01) |
| ***H10K 50/17*** | (2023.01) |
| *H10K 85/10* | (2023.01) |
| *H10K 85/60* | (2023.01) |
| *H10K 101/30* | (2023.01) |
| *H10K 102/00* | (2023.01) |

(52) U.S. Cl.
CPC ............. *H10K 50/16* (2023.02); *H10K 50/17* (2023.02); *H10K 85/00* (2023.02); *H10K 85/111* (2023.02); *H10K 85/1135* (2023.02); *H10K 85/115* (2023.02); *H10K 85/626* (2023.02); *H10K 85/6572* (2023.02); *H10K 2101/30* (2023.02); *H10K 2102/351* (2023.02)

(58) Field of Classification Search
CPC ...... H10K 50/17; H10K 85/00; H10K 85/111; H10K 85/1135; H10K 85/115; H10K 85/626; H10K 85/6572; H10K 2101/30; H10K 2102/351; H10K 2101/40; H10K 50/11
USPC ............................................................ 257/40
See application file for complete search history.

(56) References Cited

U.S. PATENT DOCUMENTS

| | | | | |
|---|---|---|---|---|
| 2003/0107313 | A1* | 6/2003 | Andriessen | C09K 11/565 313/506 |
| 2004/0023010 | A1* | 2/2004 | Bulovic | B82Y 30/00 428/209 |
| 2004/0170864 | A1* | 9/2004 | Liu | C09K 11/02 428/917 |
| 2005/0236556 | A1* | 10/2005 | Sargent | B82Y 10/00 250/214.1 |
| 2006/0063029 | A1* | 3/2006 | Jang | H10K 50/11 427/508 |
| 2006/0236918 | A1* | 10/2006 | Jun | H05B 33/14 117/68 |
| 2007/0285010 | A1* | 12/2007 | Lee | H10K 50/14 313/504 |
| 2008/0029760 | A1* | 2/2008 | Jun | C30B 7/005 438/30 |
| 2008/0217602 | A1* | 9/2008 | Kahen | H10H 20/818 257/13 |
| 2009/0102368 | A1 | 4/2009 | Shitagaki et al. | |
| 2009/0162448 | A1* | 6/2009 | Dunwoody | A61P 33/00 424/490 |
| 2009/0243469 | A1* | 10/2009 | Horiba | H10K 85/111 313/504 |
| 2009/0278141 | A1* | 11/2009 | Coe-Sullivan | B82Y 20/00 257/89 |
| 2011/0080090 | A1* | 4/2011 | Wood | H05B 33/14 977/932 |
| 2012/0211074 | A1* | 8/2012 | Sager | B22F 1/17 136/265 |
| 2013/0038204 | A1* | 2/2013 | Sumida | H10K 59/876 313/504 |
| 2014/0302627 | A1* | 10/2014 | Ko | C09K 11/565 252/301.16 |
| 2016/0133878 | A1* | 5/2016 | Uesaka | H10D 86/60 257/40 |
| 2016/0233449 | A1* | 8/2016 | Murayama | C09K 11/025 |
| 2017/0037314 | A1* | 2/2017 | Nam | C09K 11/62 |
| 2018/0019371 | A1* | 1/2018 | Steckel | C09K 11/025 |
| 2018/0327622 | A1* | 11/2018 | Pan | H10K 71/15 |
| 2018/0375046 | A1* | 12/2018 | Lee | C09K 11/02 |
| 2019/0006607 | A1* | 1/2019 | Yang | B82Y 20/00 |
| 2019/0071603 | A1* | 3/2019 | Qian | C09K 11/883 |
| 2019/0131557 | A1 | 5/2019 | Lee et al. | |
| 2019/0280230 | A1* | 9/2019 | Seo | H10K 50/115 |
| 2019/0326533 | A1* | 10/2019 | Kim | C09K 11/0805 |
| 2020/0362240 | A1* | 11/2020 | Yang | C09K 11/565 |
| 2021/0066633 | A1* | 3/2021 | Lee | C09K 11/02 |
| 2021/0332295 | A1* | 10/2021 | Wu | C09K 11/565 |

FOREIGN PATENT DOCUMENTS

| | | | |
|---|---|---|---|
| CN | 101803058 | A | 8/2010 |
| CN | 109713098 | A | 5/2019 |
| CN | 110165066 | A | 8/2019 |
| CN | 110246973 | A | 9/2019 |
| CN | 111384258 | A | 7/2020 |
| CN | 112079767 | A | 12/2020 |
| WO | WO-2017/216557 | A1 | 12/2017 |

OTHER PUBLICATIONS

Written Opinion dated Mar. 16, 2022; International Application No. PCT/CN2021/142734; 4 pages (English Translation).
International Search Report dated Mar. 16, 2022; International Application No. PCT/CN2021/142734; 3 pages.
Written Opinion dated Mar. 16, 2022; International Application No. PCT/CN2021/142734; 3 pages.
Office Action and Search Report with English translation from corresponding Chinese Patent Application No. 202011643638.9, dated Apr. 2, 2026, 18 pages.

* cited by examiner

PHOTOELECTRIC DEVICES

CROSS REFERENCE TO RELATED APPLICATIONS

This application is the national phase entry of International Application No. PCT/CN2021/142734, filed on Dec. 29, 2021, which is based upon and claims priority to Chinese Patent Application No. 202011643638.9, filed on Dec. 31, 2020, the entire contents of which are incorporated herein by reference.

TECHNICAL FIELD

The present application relates to the field of display technology, and in particular, to photoelectric devices.

BACKGROUND

The statements provided herein are merely background information related to the present application, and do not necessarily constitute any prior arts. Quantum dot light-emitting diode (QLED) display technology is a new type of display technology that has emerged rapidly in recent years. Similar to the organic light-emitting diode (OLED) display, QLED display technology is an active light-emitting technology, and thus also has advantages of high luminous efficiency, fast response speed, high contrast and wide viewing angle. Due to excellent inherent material characteristics of quantum dots in the QLED display technology, QLED has more performance advantages than OLED in many aspects, such as: a luminescence of quantum dots is continuously adjustable and a luminescence width is extremely narrow, which can realize a wider color gamut and a higher purity display; an inorganic material characteristic of the quantum dots enables QLED to have a better device stability; a driving voltage of the QLED device is lower than that of the OLED device, which can achieve higher brightness and reduce energy consumption. Moreover, the QLED display technology matches with the production process and technology of typographical display, which can achieve high-efficiency mass production and preparation with large size, low cost and crimp ability. Therefore, QLED display is considered to be one of the preferred technologies of the next-generation display screen with light, portable, flexible, transparent, and high-performance in the future.

Due to the similarity of QLED and OLED display technologies in the optical principle, in the process of development of QLED display technology, the device structure of QLED is learn from the OLED display technology mostly, except for that the light-emitting layer material is changed from organic light-emitting materials to quantum dot materials, other functional layer materials such as charge injection layer or charge transport layer materials are often made use of the existing materials in OLED. In addition, the physical interpretation of the device in the QLED device, the selection and matching principles of functional layers of material energy levels also follow the existing theoretical system in OLED. The application of the classical device physics conclusions obtained in the research of OLED devices to the QLED device system has significantly improved the performance of QLED devices, especially the efficiency of QLED devices.

However, the lifetime of QLED devices cannot be effectively improved based on the current classic ideas and strategies formed in OLED. Although the classic ideas and strategies of OLED devices can improve the efficiency of QLED devices, it is revealed based on researches that the lifetime of the QLED device having a high efficiency is significantly reduced compared to a similar device having a lower efficiency. That is, conventional structures of QLED devices designed based on the theoretical system of OLED devices cannot achieve simultaneous improvements of photoelectric efficiency and lifetime performance of QLED devices. It is desirable to develop a new and more targeted new QLED device structures corresponding to the unique device mechanism of QLED device systems.

SUMMARY

One objective of the embodiments of the present application is to provide a photoelectric device, which aims at solving the problem that it is difficult to simultaneously improve the photoelectric efficiency and lifetime performance of QLED devices in the related technologies.

To solve the above technical problem, technical solutions adopted in the embodiments of the present application include that:

In accordance with a first aspect, a photoelectric device is provided, including: an anode, a first hole injection layer arranged on the anode, a hole transport layer arranged on the first hole injection layer, a quantum dot light-emitting layer arranged on the hole transport layer, and a cathode arranged on the quantum dot light-emitting layer. An absolute value of a difference between a maximum energy level of valence band of a hole transport material in the hole transport layer and a work function of a first hole injection material in the first hole injection layer is smaller than or equal to 0.2 eV.

Beneficial effects of the photoelectric device provided by the embodiment of the present application are described below: through a limitation of $|\Delta EH_{TL-HIL}|$ being smaller than or equal to 0.2 eV, an energy-level barrier for hole injection between a hole transport layer (HTL) and a hole injection layer (HIL) is enabled to be significantly reduced, which improves an injection efficiency of holes from the anode, and is conducive to the effective injection of holes from HIL to HTL, which also eliminates a barrier and interface charges, and reduces an overall resistance of the device, thereby avoiding irreversible damage caused by charge accumulation at the interface between HIL and HTL, reducing a driving voltage of the device and prolonging a lifetime of the device. If $|\Delta EH_{TL-HIL}|$ is greater than 0.2 eV, a charge accumulation is easily formed at an interface energy-level barrier from HIL to HTL, which will cause irreversible damage to the interfaces between HIL and HTL under the action of electric field, thereby resulting in a rise in device voltage and an attenuation in device brightness.

BRIEF DESCRIPTION OF DRAWINGS

In order to illustrate the technical solutions in the embodiments of the present application more clearly, the following will briefly introduce the drawings that need to be used in descriptions of the embodiments or exemplary technologies. Obviously, the drawings in the following descriptions are merely some examples of the present application. For those skilled in the art, other drawings may also be obtained based on these drawings on the premise of paying no creative efforts.

DETAILED DESCRIPTION OF THE EMBODIMENTS

Figure 1:
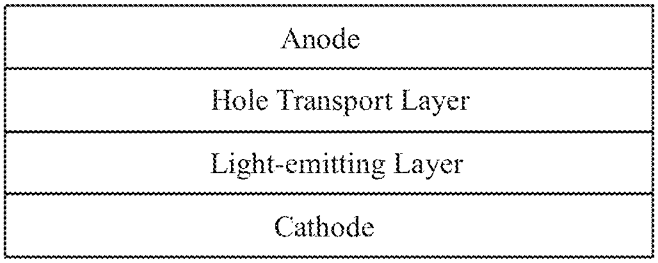
FIG. 1 is a schematic structural view of a photoelectric device according to a first aspect of the present application.

In order to explain the objectives, technical solutions and advantages of the present application more clearly, the present application will be described in detail below in conjunction with the accompanying drawings and embodiments. It should be understood that the specific embodiments described here are only used to explain the present application rather than being intended to limit the present application.

In the present application, the term "and/or" describes an association relationship of associated objects, it is indicated that three relationships may be included, for example, A and/or B may include three cases, that is, A exists alone, A and B exist simultaneously, and B exists alone, where A and B may be singular or plural.

In the present application, "at least one" means one or more, and "a/the plurality of" means two or more. "At least one of the following [items]" or similar expressions refer to any combination of these items, including any combination of single or plural items. For example, "at least one of a, b, or c", or "at least one of a, b, and c" may both refer to: a, b, c, a-b (i.e., a and b), a-c, b-c, or a-b-c, where a, b, and c may be single or multiple.

It should be understood that in various embodiments of the present application, sequence numbers of the above-mentioned processes do not necessarily mean an order of execution, and some or all steps may be executed in parallel or sequentially. The execution order of processes shall be determined based on functions and an internal logic of these processes, and should not constitute any limitation to an implementation process of the embodiments of the present application. Terms used in the embodiments of the present application are used only for the purpose of describing specific embodiments, and are not intended to limit the present application. The singular forms "a" and "the" used in the embodiments of the present application and the appended claims are also intended to include plural forms unless the context clearly indicates otherwise.

In the embodiment of the present application, $\Delta E_{HTL\text{-}HIL}=E_{HOMO,\ HTL}-E_{HIL}$, $\Delta E_{EML\text{-}HTL}=E_{HOMO,\ EML}-E_{HTL}$, all energy level/work function values are taken as absolute values, and a large absolute value of energy level indicates a deep energy level, and a small absolute value of energy level indicates a shallow energy level.

A core concept of the present application is to simultaneously improve the lifetime and photoelectric efficiency of QLED devices. At present, there is a significant difference between a test of device lifetime and a characterization of device efficiency. Time for testing a device efficiency is usually short, so the characterization of device efficiency is to characterize an instantaneous state of the QLED device at the beginning of operation, while the test of device lifetime is to characterize a continuous operation of the device and represents an ability to maintain the device efficiency after the device enters a stable state.

At present, based on the existing theoretical system of traditional OLED devices, it is believed that an injection rate of electrons into a light-emitting layer is usually faster than that of holes. Thus, a hole injection layer is usually disposed in the QLED device to equilibrate and improve a recombination efficiency of holes and electrons in the light-emitting layer of the QLED device, and an injection barrier between two adjacent functional layers is minimized to enhance an efficiency of hole injection, thereby improving a carrier injection efficiency and reducing an interface charge accumulation. However, this approach can only improve a photoelectric efficiency at the initial instant of the QLED device to a certain extent, but cannot improve the lifetime performance of the device at the same time, or even reduce the device lifetime. It is revealed in the present application, through the gradual development and in-depth research on the mechanism of QLED devices, that the QLED devices have some special mechanisms different from OLED device systems due to the use of quantum dot materials and other nanomaterials having special material surfaces in the QLED device system. This mechanism is closely related to the performance of QLED devices, especially the device lifetime.

Specifically, it is revealed in the present application through research that: when the QLED device is in an initial operation state, the injection rate of electrons in the light-emitting layer is faster than that of holes, as a result, the quantum dot material is negatively charged, and this negatively-charged state will be maintained due to the structural characteristics of the quantum dot material, the binding effect of the surface ligand, the coulomb blocking effect and other factors. However, the negatively-charged state of the quantum dot material renders the injection of electrons being more and more difficult during a continuous operation of the QLED device, thereby resulting in a disequilibrium between actual injections of electrons and holes in the light-emitting layer. When the QLED device continues to light up until a stable state is reached, the negatively-charged state of the quantum dot material also tends to be stable, that is, the electrons newly captured and bound by the quantum dots and the electrons consumed by the radiation transition reach a dynamic balance. The injection rate of electrons into the light-emitting layer at this time is much lower than that in the initial state, and actually the injection rate of holes required to achieve an equilibrium of charge injection in the light-emitting layer is relatively low. If the efficiency of hole injection is still improved based on the theoretical system of traditional OLED devices, the use of a deep-level hole transport layer can only form an instantaneous equilibrium of charge injection at the initial operation state of QLED device, and achieve a high device efficiency at the initial instant. However, as the QLED device enters a stable operation state, excessive hole injection will instead aggravate the disequilibrium of electrons and holes in the light-emitting layer of the device, and the efficiency of the QLED device cannot be maintained and decreases accordingly. In addition, the disequilibrium in charges will continue to intensify as the device continues to operate, and correspondingly the lifetime of the QLED device will be caused to decline rapidly.

Therefore, to achieve the equilibrium of charge injection in the light-emitting layer of the device and obtain a device with higher efficiency and longer service life, a key to fine-tuning the carrier injection of holes and electrons on both sides of the device is to: on the one hand, adjust the rate of hole injection to a lower rate, balance the rate of hole injection and the rate of electron injection in the stable operation state of the QLED device, and improve the recombination efficiency of the QLED device. On the other hand, due to that the injection rate of holes required by the QLED device in the actual stable operation state is lower than traditional expectations, carrier accumulation is prone to occur, which will cause irreversible damage to the device. Therefore, it is necessary to avoid the influence of carrier accumulation on the device lifetime as much as possible, so as to improve the lifetime performance of the device.

As shown in FIG. 1, a first aspect of the embodiments of the present application provides a photoelectric device, which includes: an anode, a hole transport layer arranged on the anode, a quantum dot light-emitting layer arranged on the hole transport layer, and a cathode arranged on the quantum dot light-emitting layer, the quantum dot light-emitting layer includes a quantum dot material of a core-shell structure, and a difference in maximum energy level of valence band between an outer shell material of the quantum dot material and the hole transport material in the hole transport layer is greater than or equal to 0.5 eV.

In the photoelectric device according to the first aspect of the present application, the difference in maximum energy level of valence band being greater than or equal to 0.5 eV is constructed between the outer shell material of the quantum dot material and the hole transport material, that is, $\Delta E_{EML-HTL} \geq 0.5$ eV. The efficiency of hole injection is reduced by increasing a hole injection barrier, thereby achieving the equilibrium in injection of holes and electrons in the light-emitting layer. Based on the energy level characteristics of the current hole transport materials and the energy level characteristics of the outer shell material of the quantum dot material, it is revealed in the present application through research that at least an energy-level barrier of $\Delta E_{EML-HTL} \geq 0.5$ eV is required to achieve a significant decrease in efficiency of hole injection, to balance the injection efficiency of electrons and holes in the light-emitting layer. In addition, the hole injection barrier of $\Delta E_{EML-HTL} \geq 0.5$ eV in the present application will not prevent holes from being injected, because the energy level of the outer shell of the quantum dots will bend when the quantum dots are powered on, and the carriers can be injected through the tunneling effect. That is, the increase of this energy-level barrier will cause a decrease in carrier injection rate, but will not completely hinder the final injection of carriers.

The quantum dot material generally includes a semiconductor compound of II-IV group, II-VI group, II-V group, III-V group, III-VI group, IV-VI group, I-III-VI group, II-IV-VI group, II-IV-V group, etc., in the periodic table of elements, or the quantum dot material has a core-shell structure composed of at least two of the above-mentioned semiconductor compounds. In some embodiments, the quantum dot material of the core-shell structure includes an inner core and an outer shell. In other embodiments, the quantum dot material of the core-shell structure includes an inner core, an outer shell, and an intermediate bridge layer between the inner core and the outer shell. The intermediate bridge layer may be one layer or multiple layers. In the quantum dot material of the core-shell structure, a material of the inner core determines the luminescence performance, and a material of the outer shell protects the luminescence stability of the inner core and facilitates carrier injection. Electrons and holes are injected into the inner core through the outer shell to emit light. Generally, the band gap of the inner core is narrower than that of the outer shell, so a difference in valence band energy level between the hole transport material and the quantum dot inner core is smaller than that between the hole transport material and the quantum dot outer shell. Therefore, in the embodiment of the present application, the $\Delta E_{EML-HTL}$ being greater than or equal to 0.5 eV can simultaneously ensure that hole carriers are effectively injected into the inner core of the quantum dot material. The specific structure and specific material type of the core-shell quantum dot material in the embodiments of the present application will be described in detail in the following embodiments according to different application situations.

In some embodiments, the difference in maximum energy level of valence band between the outer shell material of the quantum dot material and the hole transport material in the hole transport layer is in a range of 0.5-1.7 eV, that is, $\Delta E_{EML-HTL}$ is in a range of 0.5 eV to 1.7 eV. The range of energy-level barriers constructed between the outer shell material and the hole transport material may be applied to device systems constructed of different hole transport materials and quantum dot materials, to optimize the injection equilibrium of electrons and holes in different device systems. In practical applications, according to the specific material properties, the difference in maximum energy level of valence band $\Delta E_{EML-HTL}$ may be set different in various situations, and the carrier injection rate of holes and electrons on both sides of the light-emitting layer can be finely adjusted to equilibrate the injection of electrons and holes.

In some specific embodiments, the difference in maximum energy level of valence band between the outer shell material of the quantum dot material and the hole transport material is in a range of 0.5 eV to 0.7 eV. In this case, the hole transport material may be TFB, P12, P15, and the quantum dot outer shell material is ZnSe and CdS, that is, a device system such as TFB-ZnSe, P12/P15-CdS, etc., may be used.

In some specific embodiments, the difference in maximum energy level of valence band between the outer shell material of the quantum dot material and the hole transport material is in a range of 0.7 eV to 1.0 eV. In this case, the hole transport material may be TFB, P09, and the quantum dot outer shell material is ZnSe, CdS, that is, a device system such as P09-ZnSe, TFB-CdS, etc., may be used.

In some specific embodiments, the difference in maximum energy level of valence band between the outer shell material of the quantum dot material and the hole transport material is in a range of 1.0 eV to 1.4 eV. In this case, the hole transport material may be TFB, P09, P13, P14, the quantum dot shell material is CdS, ZnSe, ZnS, that is, a device system such as TFB-ZnS, P09-CdS, P13/P14-ZnSe, etc., may be used.

In some specific embodiments, the difference in maximum energy level of valence band between the outer shell material of the quantum dot material and the hole transport material is greater than 1.4 eV and smaller than 1.7 eV. In this case, the device systems such as P09-ZnS, P13/P14-ZnS, etc., may be used.

On the one hand, since the hole injection layer in current devices is often used to improve the efficiency of hole injection, while the QLED devices in some embodiments of the present application need to control the hole injection to a lower rate in a certain way. Therefore, in some specific embodiments, the photoelectric device according to the first aspect of the embodiment of the present application may not be provided with a hole injection layer.

On the other hand, the dispose of the hole injection layer in QLED devices can not only improve the efficiency of hole injection, but also regulate a stable and balanced injection of holes, which is one of the key factors affecting the performance and lifetime of the device. Thus, the embodiments of the present application may also adjust the efficiency of hole injection in the device, and reduce the impact of charge accumulation on the lifetime of the device by disposing a hole injection layer in the device. Specifically:

Usually, in the study of the performance of QLED devices, more attention is paid to the interface damage caused by charge accumulation on both sides of the light-emitting layer EML, such as the HTL or ETL interface, and the quenching of excitons in the EML light-emitting layer. In fact, the interface energy-level barrier from HIL and HTL is also easy to form charge accumulation, and this charge accumulation causes irreversible damage to the interfaces between HIL and HTL under the action of electric field, and then causes the device voltage to rise and the device brightness to decay. Moreover, the voltage rise of the QLED device caused in this case is significantly different from the voltage rise caused by the charge accumulation at the EML interface. The damage caused by the electric field generated due to the charge accumulation at the interfaces between the HIL and HTL is usually irreversible, and the damage is going on as the device continues to be powered on, that is, it will continue to deteriorate. By contrast, the charge accumulation at the EML interface is reversible and will reach a certain degree of saturation. Therefore, the interface charge accumulation between HIL and HTL has a greater impact on the lifetime and other performance of the device.

Figure 2:
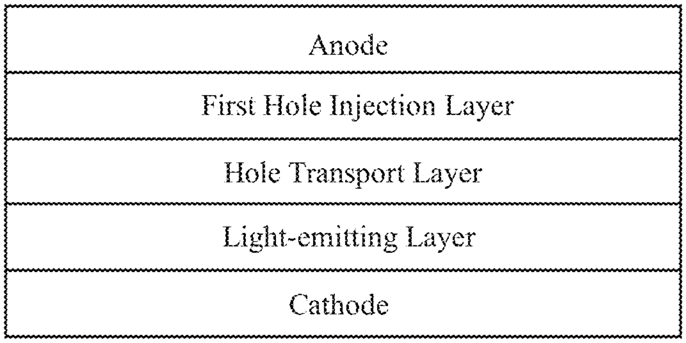
FIG. 2 is a schematic structural view of a photoelectric device according to a second aspect of the present application.

In one aspect, the embodiments of the present application aim to reduce the irreversible damage to the lifetime performance of the device caused by the charge accumulation at the HIL and HTL interfaces, and optimize the injection and recombination efficiency of carriers in the QLED device. As shown in FIG. 2, a second aspect of the embodiments of the present application provides a photoelectric device is provided on the basis of the above-mentioned embodiment of the first aspect or separately. The photoelectric device includes a first hole injection layer, and the first hole injection layer is located between the anode layer and the hole transport layer, an absolute value of a difference between a maximum energy level of valence band of the material of the hole transport layer and the work function of the first hole injection material in the first hole injection layer is smaller than or equal to 0.2 eV.

The photoelectric device according to the second aspect of the present application, through a limitation of $|\Delta E_{HTL-HIL}|$ being smaller than or equal to 0.2 eV, enables an energy-level barrier for hole injection between HTL and HIL to be significantly reduced, which improves the injection efficiency of holes from the anode, and is conducive to the effective injection of holes from HIL to HTL, eliminates potential barriers and interface charges, and reduces an overall resistance of the device, thereby reducing irreversible damage caused by the charge accumulation at the interface between HIL and HTL, reducing the driving voltage of the device, and prolonging the lifetime of the device. If $|\Delta E_{HTL-HIL}|$ is greater than 0.2 eV, the interface energy-level barrier between HIL and HTL is easy to form the charge accumulation, which causes the interfaces between HIL and HTL to be irreversibly damaged under the action of electric field, and then causes the device voltage to rise, and the device brightness to decay.

In some embodiments, the absolute value of the difference between the maximum energy level of valence band of the hole transport layer material and the work function of the first hole injection material is 0 eV. In the embodiments of the present application, $|\Delta E_{HTL-HIL}|$ is 0, in this case, the effective injection of holes from HIL to HTL is good, the potential barriers and interface charges are eliminated, and the overall resistance of the device is reduced, thereby the driving voltage of the device is reduced and the lifetime of the device is prolonged.

In some embodiments, the absolute value of the work function of the first hole injection material is in a range of 5.3 eV to 5.6 eV, this work function is fairly close to the absolute value (about 5.4 eV) of the valence band energy level of the current conventional hole transport material, which is beneficial to control $|\Delta E_{HTL-HIL}|$ in a lower range, so that the energy levels of the HIL to HTL materials are basically equal, thereby eliminating potential barriers and interface charges, reducing driving voltage of the device, and prolonging the lifetime of the device. In the embodiments of the present application, by selecting HIL and HTL materials with appropriate energy levels, to obtain the $|\Delta E_{HTL-HIL}|$ being smaller than or equal to 0.2 eV, the energy-level barrier from HIL to HTL and the charge accumulation at the interfaces can be effectively eliminated, thereby reducing the irreversible damage caused by the charge accumulation at the interfaces between HTL and HTL.

In some embodiments, a mobility of the hole transport material is higher than $1\times10^{-4}$ $cm^2/Vs$. The hole-transport material having a mobility higher than $1\times10^{-4}$ $cm^2/Vs$ is used in the embodiments of the present application. It is revealed by the inventors, through a large number of experiments, that the hole-transport material having the above-mentioned mobility can improve the hole transport and migration effect, prevent the charge accumulation, eliminate the interface charges, better reduce driving voltage of the device, and prolong the lifetime of the device.

Figure 3:
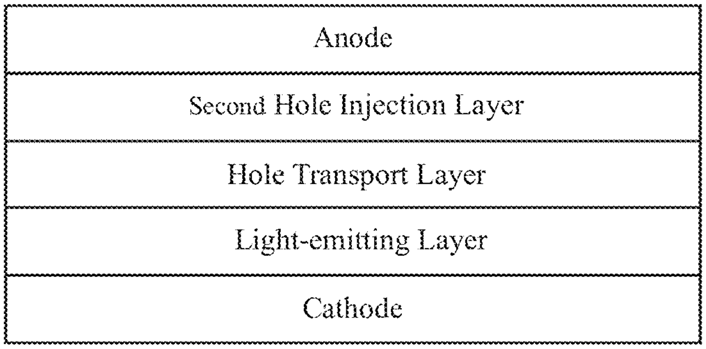
FIG. 3 is a schematic structural view of a photoelectric device according to a third aspect of the present application.

In another aspect, the embodiments of the present application aim to reduce the rate of hole injection in the QLED device, regulate the injection and recombination efficiency of carriers, and reduce the irreversible damage to the lifetime performance of the device caused by the charge accumulation at the HIL and HTL interfaces. As shown in FIG. 3, a third aspect of the embodiments of the present application provides a photoelectric device on the basis of the above-mentioned embodiment of the first aspect or separately. The photoelectric device includes a second hole injection layer, and the second hole injection layer is located between the anode and the hole transport layer, a difference between the maximum energy level of valence band of the hole transport layer material in the hole transport layer and a work function of a second hole injection material in the second hole injection layer is smaller than −0.2 eV.

In the photoelectric device according to the third aspect of the present application, by constructing an injection barrier being smaller than −0.2 eV between the hole transport layer material and the second hole injection material, that is, $\Delta E_{HTL-HIL}<-0.2$ eV, the hole injection barrier from the anode to HIL is increased, thereby the overall injection rate of holes in the QLED device is reduced, and the number of holes injected into the QLED device is effectively controlled. On the one hand, the injection rate of holes into the light-emitting layer is effectively reduced, which enables an equilibrium in injection rate of holes and electrons in the light-emitting layer, and improves the recombination efficiency of carriers. On the other hand, the charge accumulation formed at the HTL and HIL interfaces due to excessive hole injection can be avoided to prevent irreversible damage to the device lifetime caused by the accumulation of interface charges. Meanwhile, a hole blocking barrier from HTL to HIL is formed to prevent holes from diffusing to the HIL layer, which improves a utilization rate of holes, and ensures the effective "survival" of holes before being injected into the light-emitting layer. On the basis of ensuring the equilibrium of carrier injection in the stable operation state of the device, the holes injected in the device are fully and effectively used to ensure the luminous efficiency of the device, thereby achieving simultaneous improvements in device efficiency and lifetime.

In some embodiments, the quantum dot material of the core-shell structure is contained in the quantum dot light-emitting layer of the photoelectric device, where a difference in maximum energy level of valence band between the outer shell material of the quantum dot and the hole transport material is greater than 0 eV, that is, $\Delta E_{EML-HTL}>0$. The energy level of the light-emitting layer is deeper than that of the hole transport layer. Meanwhile, an injection barrier being smaller than −0.2 eV is existed between the material of the hole transport layer and the second hole injection material, that is, $\Delta E_{HTL-HIL}<-0.2$ eV, and the energy level of the hole injection layer is deeper than that of the hole transport layer. In this case, a "deep-shallow-deep" energy level structure is formed among the light-emitting layer, the hole transport layer and the hole injection layer, so that the holes injected into the hole transport layer form a hole carrier trap, to effectively "store" the accumulated holes without diffusing to other functional layers or interfaces other than the HTL layer. And the influence of interface charges on the device is also eliminated, on the basis of ensuring the equilibrium of carrier injection in the stable operation state of the device, the holes injected in the device are used more effectively and fully, which ensures the luminous efficiency of the device, and achieves the simultaneous improvements in device efficiency and lifetime. In some specific embodiments, the difference in the maximum energy level of valence band between the outer shell material of the quantum dot material and the hole transport material is greater than or equal to 0.5 eV. In some other specific embodiments, the difference in the maximum energy level of valence band between the outer shell material of the quantum dot material and the hole transport material may also range from 0.5 eV to 1.7 eV, that is, $\Delta E_{EML-HTL}$ is in a range of 0.5 eV to 1.7 eV. It has been verified base on experiments that the effect of the hole carrier trap formed in the above embodiment is good. In the actual application process, the equilibrium in injection of holes and electrons in the light-emitting layer of the device can be more precisely regulated through hole carrier trap, to improve the carrier recombination efficiency.

In some embodiments, the difference between the maximum energy level of valence band of the hole transport layer material and the work function of the second hole injection material is in a range of −0.9 eV to −0.2 eV, that is, $\Delta E_{HTL-HIL}$ is in a range of −0.9 eV to −0.2 eV, within this range, a better balance effect on hole injection and transport can be achieved. If $\Delta E_{HTL-HIL}$ is smaller than −0.9 eV, a hole injection resistance will increase, resulting in a decrease in injection number of holes, which will affect the equilibrium injection and effective recombination of holes and electrons in the light-emitting layer. If $\Delta E_{HTL-HIL}$ is greater than −0.2 eV, a hole accumulation will be easily formed at the interfaces, and the utilization rate is not high.

In some embodiments, the absolute value of the work function of the second hole injection material is in a range of 5.4 eV to 5.8 eV. The absolute value of the work function of the second hole injection material in the embodiments of the present application is in a range of 5.4 eV to 5.8 eV, which is conducive to forming a hole blocking barrier with an energy-level difference being smaller than −0.2 eV with respect to the hole transport material. Specifically, the absolute value of the valence band of conventional hole transport materials is about 5.3-5.4 eV, and a negative energy-level difference in work function being smaller than −0.2 eV can be formed between the second hole injection material having an absolute value of work function being greater than or equal to 5.4 eV and conventional hole transport materials, thereby the hole blocking barrier is formed, which optimizes the injection rate of holes, and improves the hole utilization rate.

In some embodiments, the mobility of the hole transport material is higher than $1\times10^{-4}$ $cm^2/Vs$. The hole transport material having a mobility higher than $1\times10^{-4}$ $cm^2/Vs$ is used in the embodiments of the present application to ensure the hole transport and migration effect, prevent the charge accumulation, eliminate the interface charges, better reduce the driving voltage of the device, and prolong the lifetime of the device.

In the above embodiments of the second aspect and the third aspect of the present application, the hole injection material is a metal oxide material. That is, in some specific embodiments, when the photoelectric device includes a first hole injection layer, the first hole injection material in the first hole injection layer is selected from metal oxide materials. In some other specific embodiments, when the photoelectric device includes a second hole injection layer, the second hole injection material in the second hole injection layer is selected from metal oxide materials. In the above embodiments of the present application, the metal oxide material used as the hole injection material has better stability and does not have acidity, which can not only meet the requirements for hole injection in the above embodiments, but also will not negatively affect the adjacent functional layers. Thus, the attenuation of the device lifetime caused by the thermal effect or electrical effect of the organic hole injection material during an operation process of the device is avoided, and the damage of the acidity of the organic hole injection material to the adjacent functional layers is also avoided at the same time.

In some embodiments, the metal oxide material includes: at least one metal nanomaterial such as tungsten oxide, molybdenum oxide, vanadium oxide, nickel oxide, and copper oxide, etc. These metal nanomaterials have good stability and no acidity. In the actual application process, the size of the work function can be adjusted to realize the construction of energy-level barriers of different sizes with the hole transport layer, which is conducive to regulating the hole injection and transport, improving the carrier recombination efficiency, and reducing the impact of charge accumulation on the lifetime of the device.

In some embodiments, the particle size of the metal oxide material is in a range of 2 nm to 10 nm. The metal oxide material having a small particle size is conducive to depositing a thin film having a dense film layer and a uniform thickness, which improves a binding tightness with the adjacent functional layers, reduces an interface resistance, and is beneficial to improve the device performances.

In other embodiments, the hole injection material may also use poly (3,4-ethylenedioxythiophene)-polystyrene sulfonic acid (PEDOT:PSS), HIL2, HIL1-1, HIL1-2, copper phthalocyanine (CuPc), 2,3,5,6-tetrafluoro-7,7',8,8'-tetracyanoquinone-dimethyl (F4-TCNQ), 2,3,6,7,10, 11-hexamyano-1,4,5,8,9, 12-hexazepenanthrene (HATCN) and other organic hole injection materials. Among them, PEDOT: PSS contains organic molecules having a structural formula:

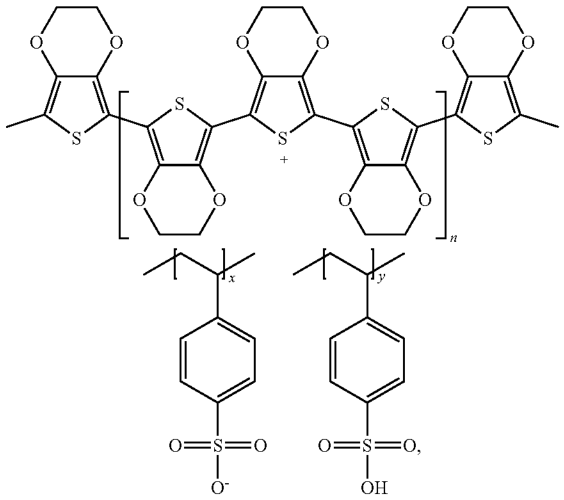

and a work function of PEDOT: PSS is-5.1 eV; HIL2 contains organic molecules having a structural formula:

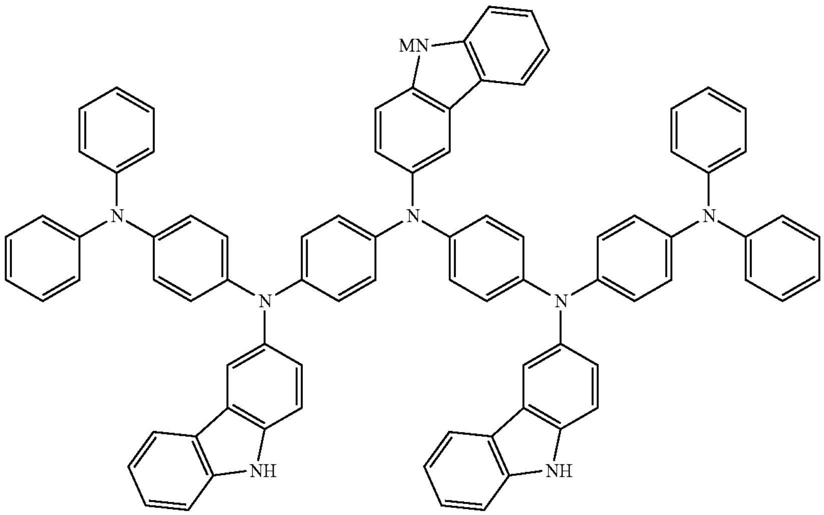

and

-continued
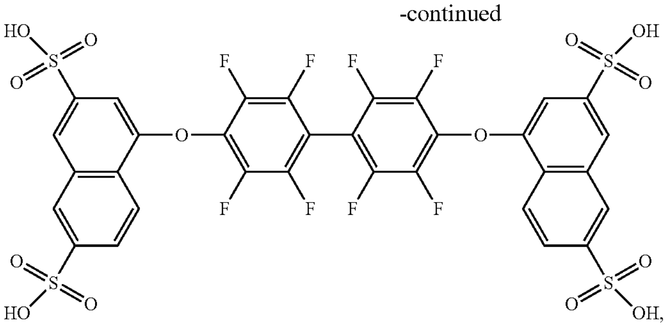
a work function of HIL2 is −5.6 eV; HIL1-1 and HIL1-2 both contain organic molecules having a structural formula:
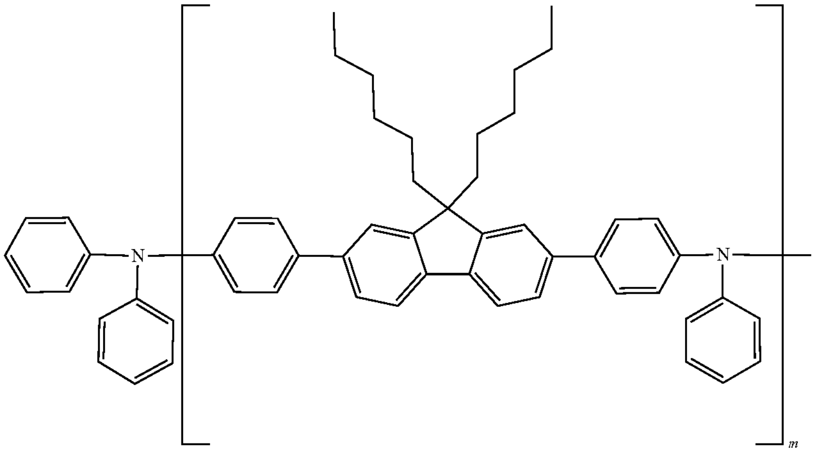
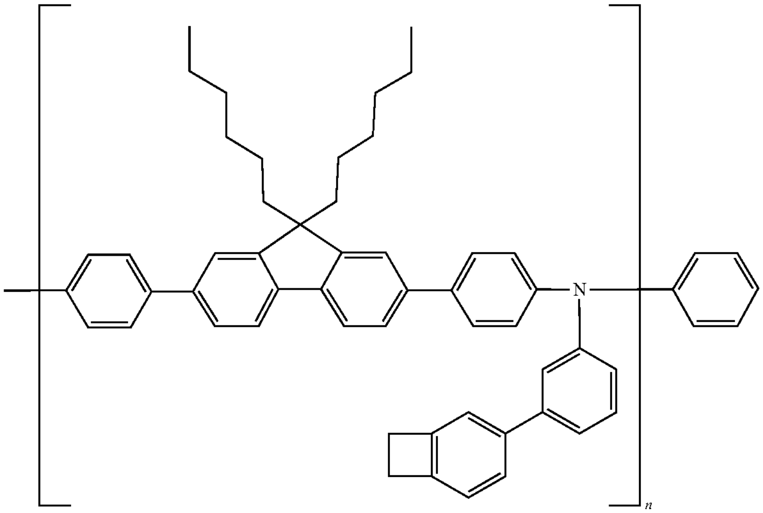
and -continued

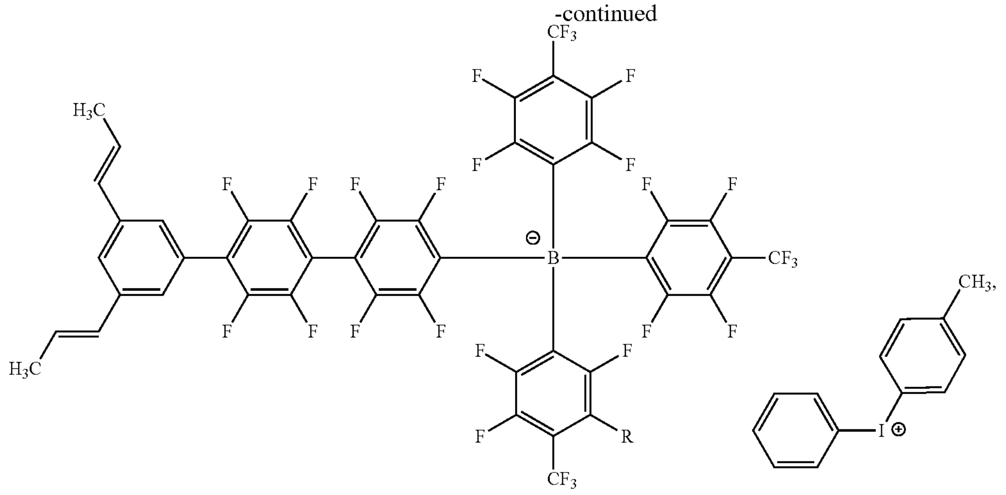

a work function of HIL1-1 is −5.4 eV, and a work function of HIL1-2 is-5.3 eV.

In some embodiments, the first hole injection layer has a thickness of 10-150 nm. In some other embodiments, the second hole injection layer has a thickness of 10-150 nm. The thickness of the hole injection layer of the present application can be flexibly adjusted according to actual application requirements, and the rate of hole injection can also be better adjusted by adjusting the thickness of the hole injection layer.

Figure 4:
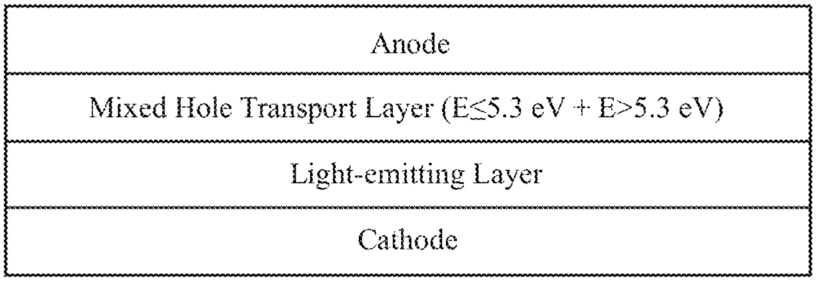
FIG. 4 is a schematic structural view of a photoelectric device according to a fourth aspect of the present application.

The embodiments of the present application aim to construct an energy-level barrier of $\Delta E_{EML-HTL}$ being greater than or equal to 0.5 eV, realize the objectives of reducing the rate of hole injection in the QLED device, and regulating the injection and recombination efficiency of carriers, and reduce the irreversible damage on the lifetime performance of the device caused by the charge accumulation at the HIL and HTL interfaces. As shown in FIG. 4, a fourth aspect of the embodiment of the present application provides a photoelectric device, the hole transport layer of the photoelectric device contains at least two hole transport materials, wherein the absolute value of the maximum energy level of valence band of at least one hole transport material is smaller than or equal to 5.3 eV. In a specific embodiment, the above at least two hole transport materials include at least a hole transport material whose absolute value of the maximum energy level of valence band is smaller than or equal to 5.3 eV and a hole transport material whose absolute value of the maximum energy level of valence band is greater than 5.3 eV.

The hole transport layer of the photoelectric device according to the fourth aspect of the present application is a mixed material layer including a variety of hole transport materials having different maximum energy level of valence bands, where the maximum energy level of valence band of at least one hole transport material is smaller than or equal to 5.3 eV, while the energy levels at the outer shells of conventional light-emitting quantum dot materials are often relatively deep (6.0 eV or deeper), therefore, an energy level difference being greater than or equal to 0.5 eV is formed between the hole transport material having shallow energy level and the quantum dot outer shell material. In addition, the inclusion of a hole transport material having an absolute value of the maximum energy level of valence band greater than 5.3 eV enables a slight and more refined regulation of the energy level difference between the hole transport material and the outer shell luminescent material. Thus, in the hole transport layer, through a combination of a shallow energy-level hole transport material having an absolute value being smaller than or equal to 5.3 eV and a deep energy-level hole transport material having an absolute value being greater than 5.3 eV, a fine control of the hole injection barrier between the hole transport material and the quantum dot outer shell can be realized, and meanwhile, the hole mobility in the HTL layer can also be regulated through the hole transport materials having different energy levels. Thus, the energy-level barrier of $\Delta E_{EML-HTL}$ being greater than or equal to 0.5 eV can be obtained. By increasing the hole injection barrier and reducing the efficiency of hole injection, the equilibrium in injection of holes and electrons in the light-emitting layer can be improved, the luminous efficiency of the device can be improved, and meanwhile, the impact of charge accumulation on the lifetime of the device can be reduced.

In some embodiments, the hole transport layer of the photoelectric device contains at least two hole transport materials, and the at least two hole transport materials at least include a hole transport material whose absolute value of the maximum energy level of valence band is smaller than or equal to 5.3 eV, and a hole transport material whose absolute value of the maximum energy level of valence band of is greater than 5.3 eV and smaller than 5.8 eV. In some embodiments, the hole transport layer contains at least two hole transport materials, and the at least two hole transport materials at least include a hole transport material whose absolute value of the maximum energy level of valence band is smaller than or equal to 5.3 eV, and a hole transport material whose absolute value of the maximum energy level of valence band is greater than 5.8 eV. In some other embodiments, the hole transport layer contains at least three hole transport materials, and the at least three hole transport materials at least include a hole transport material whose absolute value of the maximum energy level of valence band is smaller than or equal to 5.3 eV, a hole transport material whose absolute value of the maximum energy level of valence band is greater than 5.3 eV and smaller than 5.8 eV, and a hole transport material whose absolute value of the maximum energy level of valence band is greater than or equal to 5.8 eV. In the embodiments of the present application, through the mixing and matching of shallow energy level materials and deep energy level materials, the hole injection barrier can be flexibly adjusted according to actual application requirements, device systems and other factors, so that the injection energy-level barrier of holes to the light-emitting material is greater than or equal to 0.5 eV, thereby the injection efficiency of holes is reduced, which enables an injection equilibrium of holes and electrons in the light-emitting layer, and the application is flexible and convenient.

In some embodiments, when the hole transport layer includes a hole transport material whose maximum energy level of valence band is greater than 5.3 eV and smaller than 5.8 eV, the electron transport layer of the photoelectric device may include at least one of an organic electron transport material layer, an oxide nanoparticle (such as ZnO nanoparticles and other metals) layer, a sputter deposited metal oxide layer. In the embodiments of the present application, when the hole transport layer at least includes a hole transport material whose maximum energy level of valence band is smaller than or equal to 5.3 eV and a hole transport layer whose maximum energy level of valence band is greater than 5.3 eV and smaller than 5.8 eV, the hole transport layer in this case has relatively moderate maximum energy level of valence band and hole mobility, which enables the hole transport layer to be well matched with conventional metal oxides such as ZnO or organic electron transport materials, which thus is conducive to the regulation of the charge equilibrium of holes and electrons.

In some embodiments, when the hole transport layer includes a hole transport material whose maximum energy level of valence band is greater than or equal to 5.8 eV, metal oxide nanoparticles may be used in the electron transport layer of the photoelectric device, and the metal oxide nanoparticles having fewer group connections on the surface may be selected. In the embodiment of the present application, when the hole transport layer includes a hole transport material having a maximum energy level of valence band being greater than 5.8 eV, in this case, both the energy level and the mobility are significantly different from that of the aforementioned shallow level hole transport material whose maximum energy level of valence band is smaller than or equal to 5.3 eV. Through different mixing ratios, a continuous regulation in a large window range can be achieved, which is suitable for QLED device systems having large variations in electron injection and transport during the process from the initial state of the device to continuous operation to a stable state, such as metal oxide nanoparticles having fewer group connections on the surface.

In some embodiments, the hole transport layer is a mixed material layer containing hole transport materials of different energy levels, where a mass percentage of the hole transport material whose absolute value of the maximum energy level of valence band is smaller than or equal to 5.3 eV is in a range of 30-90%. The shallow energy level hole transport material in this percentage is easy to form a hole injection barrier being greater than or equal to 0.5 eV with respect to the outer shell luminescent material. In practical applications, a mixing ratio of the materials of different energy levels may be flexibly adjusted according to energy level depths of the materials. In some specific embodiments, a good effect can be achieved when the mass percentage of the hole transport material whose absolute value of the maximum energy level of valence band is smaller than or equal to 5.3 eV is in a range of 50-60%.

In some embodiments, the hole transport layer is a mixed material layer containing hole transport materials of different energy levels, where the mobility of at least one hole transport material is higher than $1\times10^{-3}$ $cm^2/Vs$. The high mobility of the hole transport material in the embodiment of the present application ensures the hole transport and migration performance, and reduces the hole accumulation at the interface that may affect the performance of the device. In addition, the maximum energy level of valence band of the hole transport layer material having high hole mobility is relatively shallow, which also ensures the formation of a suitable energy gap with the quantum dot outer shell material.

In some embodiments, the hole transport layer is a mixed material layer containing hole transport materials of different energy levels, where at least one hole transport material has a mobility higher than $1\times10^{-2}$ $cm^2/Vs$. In other specific embodiments, the hole transport layer is a mixed material layer containing hole transport materials of different energy levels, where the mobility of each hole transport material is higher than $1\times10^{-3}$ $cm^2/Vs$. In the above embodiments of the present application, by optimizing the mobility of the hole transport material, while ensuring the migration efficiency of the holes, the impact of charge accumulation on the performance of the device is avoided, and meanwhile, by ensuring the matching of the hole transport materials with deep and shallow energy levels in the hole transport layer, the hole transport layer is constructed to ensure the formation of an energy-level barrier of $\Delta E_{EML-HTL}$ being greater than or equal to 0.5 eV, so as to optimize the injection equilibrium and recombination efficiency of carriers in the QLED device.

Figure 5:
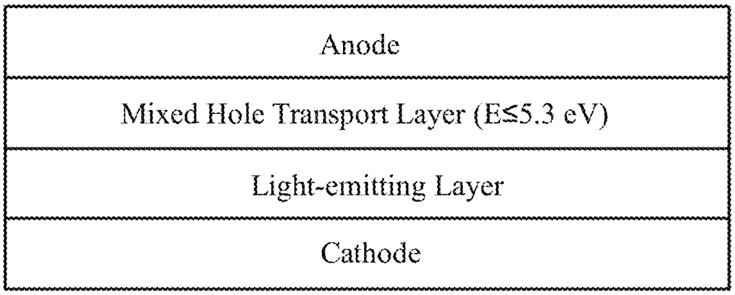
FIG. 5 is a schematic structural diagram of a photoelectric device according to a fifth aspect of the present application.

The embodiments of the present application aim to construct an energy-level barrier of $\Delta E_{EML-HTL}$ being greater than or equal to 0.5 eV, realize the objectives of reducing the rate of hole injection in the QLED device, and regulating the injection and recombination efficiency of carriers, and reduce the irreversible damage caused by the charge accumulation at the HIL and HTL interfaces on the lifetime performance of the device. As shown in FIG. 5, a fifth aspect of the embodiments of the present application provides a photoelectric device, the hole transport layer of the photoelectric device contains at least two hole transport materials, and an absolute value of the maximum energy level of valence band of each hole transport material is smaller than or equal to 5.3 eV.

The hole transport layer of the photoelectric device according to the fifth aspect of the present application is a mixed material layer containing a variety of hole transport materials having different maximum energy level of valence bands, where the maximum energy level of valence band of each hole transport material is smaller than or equal to 5.3 eV, and can form an energy level difference being greater than or equal to 0.5 eV with the light-emitting quantum dot material having a deeper shell energy level. A finer regulation of the hole injection barrier between the constructed HTL and the quantum dot outer shell in the EML is realized, which enables the device to have $\Delta E_{EML-HTL}$20.5 eV. In this way, the equilibrium in charge injection and device efficiency are maintained, and the lifetime of the device is optimized after the QLED device enters a stable operation state. In addition, the hole mobility of the mixed hole transport layer may also be finely regulated through different mixing ratios the hole transport layer materials that all have a shallow maximum energy level of valence band but different hole mobility.

In some embodiments, the hole transport layer includes a mixed material layer of hole transport materials having different energy levels, where the mass percentage of each hole transport material is in a range of 5-95%. The mixing and matching of hole transport materials having different energy level depths and different mobility has a good control effect on the hole mobility and injection barrier of the mixed hole transport layer.

In some embodiments, the hole transport layer includes a mixed material layer of hole transport materials of different energy levels, where the mobility of at least one hole transport material is higher than $1\times10^{-3}$ $cm^2/Vs$. The maximum energy level of valence band of the hole transport layer material having high hole mobility is relatively shallow. The mobility of the hole transport material is limited, and the high mobility ensures the transport and migration performance of the holes, and also ensures the formation of a more suitable injection barrier to avoid the accumulation of holes at the interface and affect the performance of the device. In some embodiments, at least one hole transport material in the hole transport layer has a mobility greater than $1\times10^{-2}$ $cm^2/Vs$. In some embodiments, the mobility of each hole transport material in the hole transport layer is higher than $1\times10^{-3}$ $cm^2/Vs$.

In some embodiments, when the maximum energy level of valence band of the hole transport material in the hole transport layer is smaller than or equal to 5.3 eV, surface passivated metal oxide nanoparticles are used in the electron transport layer of the photoelectric device, and the metal oxide nanoparticles having sufficient surface modification and passivity are selected. In the embodiment of the present application, when the maximum energy level of valence bands of the hole transport materials in the hole transport layer are all smaller than or equal to 5.3 eV, the materials with small changes in electron injection and transport shall be corresponded, in this case, it is suitable for QLED device systems having small differences in electron injection and transport during the process from the initial state of the device to continuous operation to the stable state, such as the metal oxide nanoparticles having sufficient surface modification and passivity.

In the photoelectric devices of the above embodiments of the present application, the hole transport material includes at least one of polymer containing aniline group and copolymers containing fluorene groups and aniline groups. These hole transport materials have advantages of high efficiency of hole transport, good stability, easy access, etc. In the actual application process, hole transport materials having appropriate energy levels and mobility may be selected according to actual application requirements. Specifically:

In some specific embodiments, when a photoelectric device requires a hole material whose absolute value of the maximum energy level of valence band is smaller than or equal to 5.3 eV, the hole transport material with an absolute value of the maximum energy level of valence band being smaller than or equal to 5.3 eV includes at least one of P09 and P13. Where, a structural formula of P13 is:

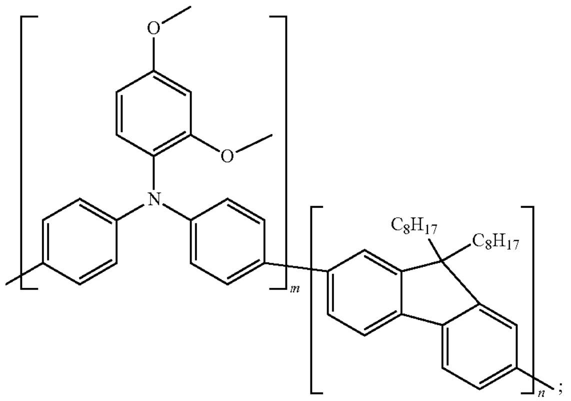

and a structural formula of P09 is:

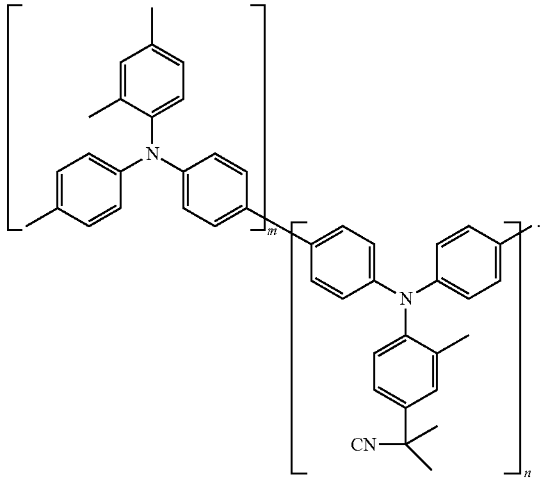

In other specific embodiments, when the photoelectric device requires a hole material whose absolute value of the maximum energy level of valence band is greater than 5.3 eV and smaller than 5.8 eV, the hole transport material with an absolute value of the maximum energy level of valence band being greater than 5.3 eV and smaller than 5.8 eV includes at least one of TFB, poly-TPD, and P11. Where, a structural formula of P11 is:

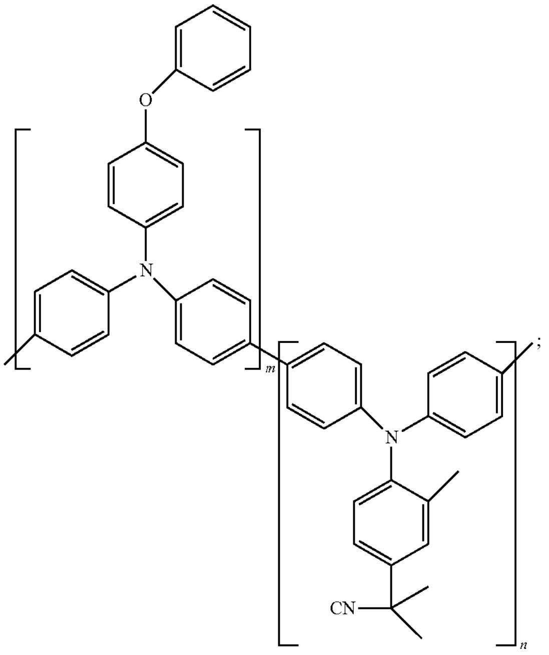

a structural formula of poly-TPD is:

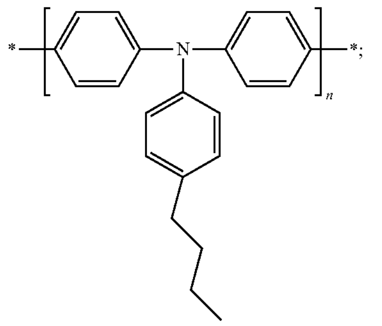

and a structural formula of TFB is:

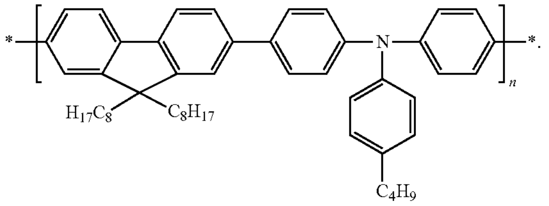

In other specific embodiments, when the photoelectric device requires a hole material whose absolute value of the maximum energy level of valence band is greater than or equal to 5.8 eV, the hole transport material with an absolute value of the maximum energy level of valence band being greater than or equal to 5.8 eV includes at least one of P15 and P12. Where, a structural formula of P12 is:

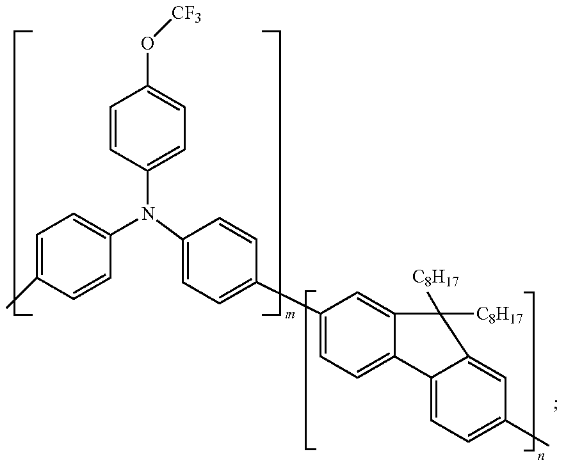

and a structural formula of P15 is:

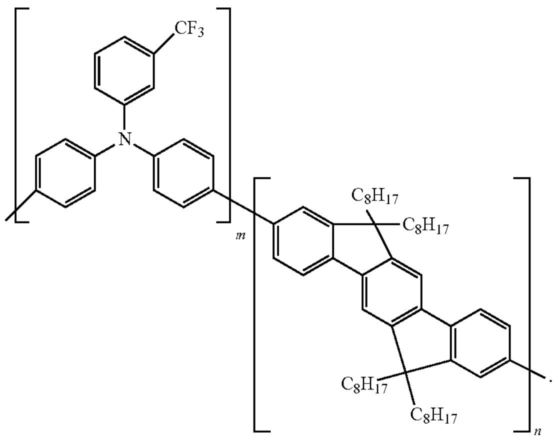

In some embodiments, the mobility of the hole transport material is higher than $1\times10^{-4}$ $cm^2/Vs$, the high mobility ensures the hole transport and migration performance, and reduces the impact of charge accumulation on the lifetime of the device.

In the above embodiments of the present application, the quantum dot material of the core-shell structure includes the above outer shell, and also includes an inner core, and an intermediate shell located between the inner core and the outer shell. Where, the maximum energy level of valence band of the inner core material is shallower than that of the outer shell material. The maximum energy level of valence band of the material in the intermediate shell is between the maximum energy level of valence band of the inner core material and the maximum energy level of valence band of the outer shell material. In the quantum dot material of the core-shell structure in the embodiment of the present application, the inner core material affects the luminescence performance, the outer shell material plays a role in protecting the luminous stability of the inner core and facilitating the carrier injection, and the intermediate shell whose valence band is between the inner core and the outer shell plays a role of intermediate transition, which is conducive to the carrier injection. The intermediate shell may form a stepped energy level transition from the inner core to the outer shell, which helps to achieve effective carrier injection, effective binding and reduced flickering of the lattice interface.

In some embodiments, the outer shell of the quantum dot material includes at least one of CdS, ZnSe, ZnTe, ZnS, ZnSeS, CdZnS, and PbS or an alloy material composed of at least two of CdS, ZnSe, ZnTe, ZnS, ZnSeS, CdZnS, and PbS. These outer shell materials not only protect the luminescence stability of the inner core, but also facilitate the injection of carriers into the inner core of the quantum dot for luminescence, and an energy-level barrier $\Delta E_{EML\text{-}HTL}$ being greater than or equal to 0.5 eV can be formed with respect to the HTL layer material. By increasing the hole injection barrier, reducing the injection efficiency of holes, the equilibrium in injection of holes and electrons in the light-emitting layer can be realized, the luminous efficiency of the device can be improved, and also the impact of charge accumulation on the lifetime of the device can be reduced.

In some embodiments, the inner core of the quantum dot material includes at least one of CdSe, CdZnSe, CdZnS, CdSeS, CdZnSeS, InP, InGaP, GaN, GaP, ZnSe, ZnTe, ZnTeSe. The luminescence properties of quantum dot materials are related to the inner core materials. These materials ensure that QLED devices can emit light in the visible light range of 400-700 nm, which not only meets the range required for the application of optoelectronic display devices, but also the beneficial effect achieved by the energy level relationship of these materials can be better reflected.

In some embodiments, the intermediate shell material includes at least one of CdZnSe, ZnSe, CdZnS, CdZnSeS, CdS, and CdSeS. In a specific embodiment of the present application, the intermediate shell is selected to form a continuous and natural transition from the inner core to the outer shell in terms of composition, which helps to achieve the minimum lattice mismatch and minimum lattice defects among the inner core, the intermediate shell and the outer shell, so as to achieve the optimal luminescence performance of the core-shell quantum dot material itself.

In some embodiments, the luminescence peak wavelength range of the quantum dot material is in a range of 400-700 nm. On the one hand, this wavelength range is the range required for the application of optoelectronic display devices. On the other hand, the beneficial effects achieved by the energy level relationship of the light-emitting layer in the device in this wavelength range can be better reflected.

In some embodiments, the outer shell of the quantum dot material has a thickness of 0.2-6.0 nm, which covers the thickness of a conventional outer shell, and is widely applicable to QLED devices of different systems. If the thickness of the outer shell is too large, the rate of carrier injection into the light-emitting quantum dots through the tunneling effect will decrease. If the thickness of the outer shell is too small, the outer shell material cannot sufficiently protect and passivate the inner core material, thereby affecting the luminescence performance and stability of quantum dot materials.

In the above embodiments of the present application, the photoelectric device also includes an electron transport layer, and the electron transport material in the electron transport layer includes at least one of a metal oxide compound transport material and an organic transport material. Where, the metal oxide material generally has high electron mobility, and may be prepared into thin films in QLED devices by a solution approach or a vacuum sputtering approach. The organic electron transport layer material may enable an energy level regulation in a wide range, and may be prepared into thin films in QLED devices by a vacuum evaporation approach or the solution approach. The solution approach includes an inkjet printing, a spin coating, a spray printing, a slot coating or a screen printing, etc. More suitable electron transport materials may be flexibly selected according to actual application requirements.

In some embodiments, the metal oxide compound transport material includes at least one of zinc oxide, titanium oxide, zinc sulfide, and cadmium sulfide. The metal oxide compound transport materials used in the above embodiments of the present application all have relatively high electron mobility. In some embodiments, the metal oxide group transport material includes at least one of zinc oxide, titanium oxide, zinc sulfide, and cadmium sulfide doped with metal elements, to improve the electron mobility where, the metal elements include at least one of aluminum, magnesium, lithium, lanthanum, yttrium, manganese, gallium, iron, chromium, and cobalt. These metal elements can improve the electron mobility of the material.

In some embodiments, the particle size of the metal oxide compound transport material is smaller than or equal to 10 nm. On the one hand, the metal oxide compound transport material having a small particle size is more conducive to depositing an electron transport layer film with a dense film and a uniform thickness, improving a bonding tightness with adjacent functional layers, reducing the interface resistance, and is more conducive to improving the device performance. On the other hand, the metal oxide compound transport material with small particle size has a wider band gap, which reduces the quenching of exciton luminescence of the quantum dot material and improves the device efficiency.

In some embodiments, the electron mobility of the metal oxide compound transport material is in a range of $0^{-2}$-$10^{-3}$ $cm^2/Vs$, and the electron transport material having high mobility can reduce the charge accumulation at the interface layers and improve the efficiency of electron injection and recombination.

In some embodiments, the electron mobility of the organic transport material is higher than or equal to $10^{-4}$ $cm^2/Vs$. In some embodiments, the organic transport material includes at least one of 8-hydroxyquinoline-lithium (Alq3), octa-hydroxyquinoline-aluminum, fullerene derivative PCBM,3, 5-bis (4-tert-butyl phenyl)-4-phenyl-4 h-1,2, 4-triazole (BPT), 1,3,5-tri (1-phenyl-1 h-benzimidazole-2-yl)benzene (TPBi). These organic transport materials can realize the regulation of energy level in a wide range, which is more conducive to the regulation of the energy level of each functional layer of the device, and improves the stability and photoelectric conversion efficiency of the device.

In some embodiments, the electron transport layer has a laminated composite structure, which includes at least two sub-electron transport layers. The electron transport layer may be more flexibly regulated by selecting sub-electron transport layers having different mobility and energy level regulation characteristics, so as to better optimize the device performance.

In some embodiments, in the electron transport layer, at least one sub-electron transport layer includes a metal oxide compound transport material. In some embodiments, in the electron transport layer, all sub-electron transport layers are metal oxides, and the metal oxide materials of different sub-electron transport layers may be the same or different. That is, in a multi-layer electron transport layer where all sub-electron transport layers are metal oxides, a sub electron transport layer containing at least one layer of metal oxide nanoparticles and a sub-electron transport layer containing at least one layer of non-nanoparticle type metal oxides may be included. The sub-electron transport layer may also be a sub-electron transport layer containing doped and intrinsic metal oxides (such as Mg-doped ZnO and intrinsic ZnO). It is also possible that the sub-electron transport layers all contain the same metal oxide nanoparticles. When the sub-electron transport layers all contain the same metal oxide nanoparticles, the electron mobilities of different sub-electron transport layers may be the same or different.

In some embodiments, in the electron transport layer, at least one sub-electron transport layer includes an organic transport material. In some embodiments, in the electron transport layer, at least one sub-electron transport layer includes a metal oxide compound transport material, and at least one sub-electron transport layer includes an organic transport material, and the metal oxide materials of different sub-electron transport layers may be the same or different. The metal oxide materials are nanoparticles of the corresponding metal oxide. The electron transport layer is enabled to have both high electron mobility and the flexibility of energy level matching through a co-deployment of the metal oxide compound transport material and the organic transport material in the electron transport layer. The energy level and electron mobility of the electron transport layer can be effectively regulated, thereby achieving a full match with the hole injection. In some specific embodiments, the electron transport layer including multiple sub-electron transport layers may be a combination of ZnO nanoparticles and NaF, a combination of Mg-doped ZnO nanoparticles and NaF or other laminated composite structures.

In the quantum dot material of the core-shell structure, the inner core material affects the luminescence performance of the quantum dot material, and the outer shell material plays a protective role and facilitates the carrier injection. When the outer shell material is determined, the difference in maximum energy level of valence band between the outer shell material of the quantum dot material and the hole transport material is enabled to be greater than or equal to 0.5 eV by adjusting the thickness of the outer shell and the maximum energy level of valence band of the hole transport material, that is to construct an expected injection barrier, $\Delta E_{EML-HTL} \geq 0.5$ eV, thereby optimizing the equilibrium of electron and hole injection efficiency in the light-emitting layer, and improving the device efficiency and service life.

Figure 6:
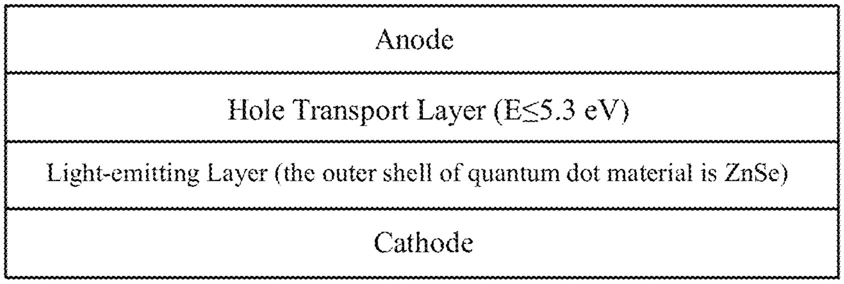
FIG. 6 is a schematic structural diagram of a photoelectric device according to a sixth aspect of the present application.

As shown in FIG. 6, a sixth aspect of the embodiment of the present application provides a photoelectric device, including a quantum dot light-emitting layer and a hole transport layer, the quantum dot light-emitting layer includes a quantum dot material of a core-shell structure, and an outer shell of the quantum dot material is ZnSe. An absolute value of the maximum energy level of valence band of the hole transport material in the hole transport layer is smaller than or equal to 5.4 eV.

In the photoelectric device according to the sixth aspect of the present application, the structure of the photoelectric device is designed on the premise that the outer shell of the quantum dot material is specifically ZnSe and according to the energy level and other characteristics of ZnSe. Specifically, since the energy level of valence band of ZnSe outer shell material is relatively shallow (i.e., the absolute value of the energy level is small), to construct a hole injection barrier with a difference in maximum energy level of valence band ($\Delta E_{EML-HTL}$) being greater than or equal to 0.5 eV, the absolute value of the maximum energy level of valence band of the hole transport material should be smaller than or equal to 5.4 eV. In this case, the hole injection barrier $\Delta E_{EML-HTL} \geq 20.5$ eV is constructed, the rate of hole injection is reduced, an equilibrium in injection efficiency of electrons and holes in the light-emitting layer is realized, the carrier accumulation is reduced, and the luminous efficiency is improved.

In some embodiments, in the quantum dot material, the ZnSe outer shell has a thickness of 2-5 nm. In the embodiment of the present application, since the band gap of ZnSe is relatively narrow, the ability to bind excitons in the inner core of the quantum dot is relatively poor. To ensure the good luminous efficiency of the core-shell the quantum dot light-emitting material itself, a thicker ZnSe outer shell is required. The selected thickness of the outer shell is 2.0-5.0 nm. If the thickness of the outer shell is too large, the rate of carrier injection into the light-emitting quantum dots through the tunneling effect will be decreased. The rate of carrier injection into the light-emitting quantum dots through the tunneling effect will be increased when the thickness of the outer shell becomes small. However, when the thickness of the outer shell is lower to a certain extent, the outer shell structure will not be able to protect and passivate the inner core sufficiently, thereby affecting the luminescence performance and stability of the quantum dot material.

In some embodiments, the luminescence peak wavelength of the quantum dot material is in a range of 510-640 nm. For blue core-shell quantum dots which have a shorter emission wavelength and a wider band gap in the core of the quantum dots, even if a thicker ZnSe outer shell is used, the luminous efficiency of the quantum dot material itself cannot be fully guaranteed. Thus, in the embodiments of the present application, the light-emitting quantum dot material should be red or green quantum dots having a luminous peak wavelength range of 510-640 nanometers, so as to better ensure the luminous efficiency of the quantum dots.

In some embodiments, the difference in maximum energy level of valence band between the ZnSe material and the hole transport material is in a range of 0.5-1.0 eV. In the embodiments of the present application, the rate of carrier injection into the light-emitting quantum dots through the tunneling effect is decreased due to the thicker ZnSe outer shell, thus the difference in maximum energy level of valence band ($\Delta E_{EML-HTL}$) of the hole transport layer material and the quantum dot outer shell material may be selected in a range of 0.5-1.0 eV. If $\Delta E_{EML-HTL}$ is too large, the efficiency of hole injection into the inner core of the light-emitting quantum dots will be reduced, which will affect the luminous efficiency of the quantum dot material.

In some embodiments, the absolute value of the maximum energy level of valence band of the hole transport material is in a range of 4.9 eV to 5.4 eV, within this range, a more suitable hole injection barrier can be constructed with the ZnSe outer shell material, and the carrier injection and recombination efficiency in the light-emitting layer can be optimized.

In some specific embodiments, the absolute value of the maximum energy level of valence band of the hole transport material is in a range of 4.9 eV to 5.4 eV, and in this case, the difference between the maximum energy level of valence bands of the ZnSe material and the hole transport material is in a range of 0.5-1.0 eV.

In some embodiments, the mobility of the hole transport material is higher than $1 \times 10^{-3}$ $cm^2/Vs$. Since the absolute value of the maximum energy level of valence band of the hole transport material used in the embodiment of the present application is smaller than or equal to 5.4 eV, the energy level is relatively shallow, the shallower maximum energy level of valence band of the hole transport layer material usually has a higher hole mobility, which is conducive to the effective transport of holes in a certain thickness of a hole transport layer film, reducing the overall resistance of the device, thereby reducing the driving voltage of the device and prolonging the lifetime of the device.

Figure 7:
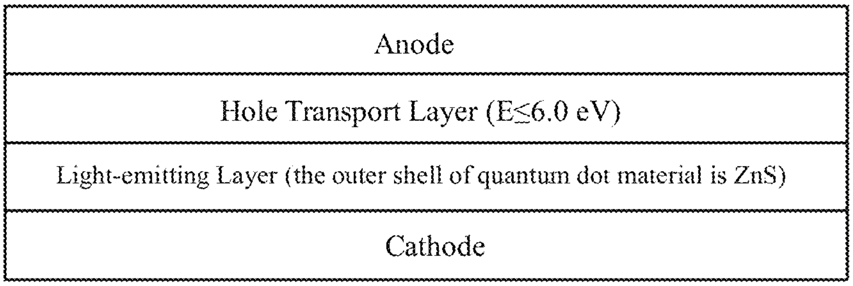
FIG. 7 is a schematic structural diagram of a photoelectric device according to a seventh aspect of the present application.

As shown in FIG. 7, a seventh aspect of the embodiment of the present application provides a photoelectric device, including a quantum dot light-emitting layer and a hole transport layer, the quantum dot light-emitting layer contains a quantum dot material of a core-shell structure, and an outer shell of the quantum dot material is ZnS. An absolute value of the maximum energy level of valence band of the hole transport material in the hole transport layer is smaller than or equal to 6.0 eV.

In the photoelectric device according to the seventh aspect of the present application, the structure of the photoelectric device is designed on the premise that the outer shell of the quantum dot material is specifically ZnS, and according to the energy level and other characteristics of ZnS. Specifically, the energy level of valence band of the ZnS outer shell material is deeper (compared to ZnSe, the absolute value of the energy level is larger), to construct a difference in maximum energy level of the valence band ($\Delta E_{EML-HTL}$) being greater than or equal to 0.5 eV, the maximum energy level of valence band of the hole transport material should be smaller than or equal to 6.0 eV. In this case, the hole injection barrier $\Delta E_{EML-HTL}$20.5 eV is constructed, the rate of hole injection is reduced, the injection efficiency of electrons and holes in the light-emitting layer is balanced, and the carrier accumulation is reduced, and the luminous efficiency is improved.

In some embodiments, the ZnS outer shell has a thickness of 0.2-2.0 nm. In the embodiments of the present application, due to the wide band gap of ZnS, the ability to bind the excitons in the inner core of the quantum dots is strong, so the use of a thinner ZnS outer shell can basically ensure the good luminous efficiency of the light-emitting quantum dot material itself, and the thickness of the outer shell is in a range of 0.2-2.0 nanometers. Meanwhile, the thinner ZnS outer shell can also effectively reduce the overall resistance of the device, reduce the driving voltage of the device and improve the performance of the device.

In some embodiments, the absolute value of the maximum energy level of valence band of the hole transport material is in a range of 4.9 eV to 6.0 eV, within this range, a more suitable hole injection barrier can be constructed with the ZnS outer shell material, and the carrier injection and recombination efficiency in the light-emitting layer can be optimized. In some embodiments, the absolute value of the maximum energy level of valence band of the hole transport material is in a range of 4.9 eV to 5.5 eV.

In some embodiments, the difference in maximum energy level of valence band between the ZnS material and the hole transport material is in a range of 1.0-1.6 eV. In the embodiment of the present application, since the ZnS outer shell has a thinner thickness, the rate of carrier injection into the light-emitting quantum dots through the tunneling effect increases, and correspondingly, the difference in maximum energy level of valence band ($\Delta E_{EML-HTL}$) between the hole transport layer material and the quantum dot outer shell material in the quantum dot light-emitting layer needs to be appropriately increased, so as to better balance the injection equilibrium of holes and electrons, and the $\Delta E_{EML-HTL}$ should be in a range of 1.0-1.6 eV. If $\Delta E_{EML-HTL}$ is too large, the efficiency of hole injection into the inner core of the light-emitting quantum dots will be reduced, which will affect the luminous efficiency of the quantum dot material.

In some embodiments, the luminescence peak wavelength of the quantum dot material is in a range of 400-700 nm. In the embodiments of the present application, the ability to bind the excitons in the quantum dot inner core is relatively strong due to the wide band gap of ZnS, which can effectively ensure the luminous efficiency of the quantum dot material itself, and is suitable for all of the quantum dot materials having a luminous peak wavelength of 400-700 nm in the visible light region. Thus, the present application has a wide range of applications.

In some embodiments, due to the deep maximum energy level of valence band (smaller than or equal to 6.0 eV) of the hole transport material used in the embodiment of the present application, the hole mobility is relatively low, and the mobility of the hole transport material is higher than $1\times10^{-4}$ $cm^2/Vs$. In some embodiments, the mobility of the hole transport material is higher than $1\times10^{-3}$ $cm^2/Vs$.

Figure 8:
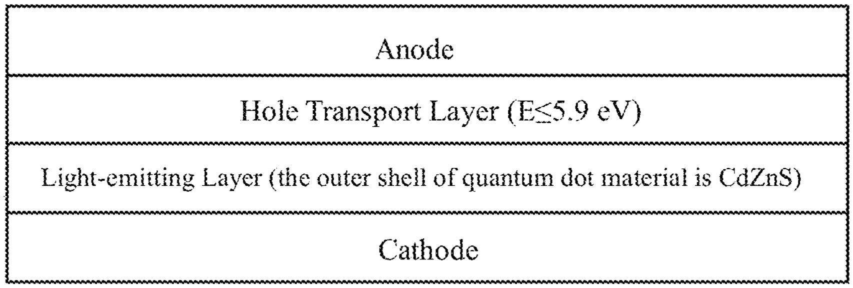
FIG. 8 is a schematic structural diagram of a photoelectric device according to an eighth aspect of the present application.

As shown in FIG. 8, an eighth aspect of the embodiment of the present application provides a photoelectric device, including a quantum dot light-emitting layer and a hole transport layer, the quantum dot light-emitting layer contains a quantum dot material of a core-shell structure, and an outer shell of the quantum dot material is CdZnS. An absolute value of the maximum energy level of valence band of the hole transport material in the hole transport layer is smaller than or equal to 5.9 eV.

In the photoelectric device according to the eighth aspect of the present application, the structure of the photoelectric device is designed on the premise that the outer shell of the quantum dot material is specifically CdZnS, and according to the characteristics such as the energy level of CdZnS. Specifically, since the outer shell of the quantum dots in this embodiment uses CdZnS, and the energy level of valence band of CdZnS is between ZnSe and ZnS, in this case, to construct a hole injection barrier having a difference in maximum energy level of valence band ($\Delta E_{EML-HTL}$) being greater than or equal to 0.5 eV, the maximum energy level of valence band of the hole transport material needs to be smaller than or equal to 5.9 eV. Through a construction of the hole injection barrier, the rate of hole injection is reduced, the injection efficiency of electrons and holes in the light-emitting layer is balanced, the carrier accumulation is reduced, and the luminous efficiency is improved.

In some embodiments, the CdZnS outer shell has a thickness of 0.5-3.0 nm. Since the band gap of CdZnS is between ZnSe and ZnS, when the thickness of the shell is in the range of 0.5-3.0 nm, the ability to bind the excitons in the inner core of the quantum dots, and the good luminous efficiency of the light-emitting quantum dot material itself can simultaneously guaranteed.

In some embodiments, the absolute value of the maximum energy level of valence band of the hole transport material is in a range of 4.9-5.9 eV, within this range, a more suitable hole injection barrier can be constructed with the CdZnS outer shell material, and the carrier injection and recombination efficiency in the light-emitting layer can be optimized. In some embodiments, the absolute value of the maximum energy level of valence band of the hole transport material is in a range of 4.9-5.5 eV.

In some embodiments, the energy level difference between the CdZnS material and the hole transport material is 0.8-1.4 eV. In the embodiments of the present application, the difference in maximum energy level of valence band ($\Delta E_{EML-HTL}$) between the hole transport layer material and the quantum dot shell material in the quantum dot light-emitting layer is in a range of 0.8-1.4 eV, which can not only ensure the efficiency of carrier injection into the light-emitting quantum dots through the tunneling effect, but also enables a better equilibrium in injection efficiency of holes and electrons. If the $\Delta E_{EML-HTL}$ is too large, the efficiency of carrier injection into the inner core of the light-emitting quantum dots through the tunneling effect will be reduced. If the $\Delta E_{EML-HTL}$ is too small, the injection rate of holes will not be well regulated.

In some embodiments, the luminescence peak wavelength of the quantum dot material is in a range of 400-700 nm. In the embodiments of the present application, CdZnS has a relatively strong binding ability to the excitons in the inner core of the quantum dots, which can effectively ensure the luminous efficiency of the quantum dot material itself, and is suitable for all quantum dot materials having a luminous peak wavelength of 400-700 nm in the visible light region. Thus, the present application has a wide range of applications.

In some embodiments, due to the deep maximum energy level of valence band (smaller than or equal to 5.9 eV) of the hole transport material used in the embodiment of the present application, the hole mobility is relatively low, and the mobility of the hole transport material is higher than $1\times10^{-4}$ $cm^2/Vs$. In some embodiments, the mobility of the hole transport material is higher than $1\times10^{-3}$ $cm^2/Vs$.

Figure 9:
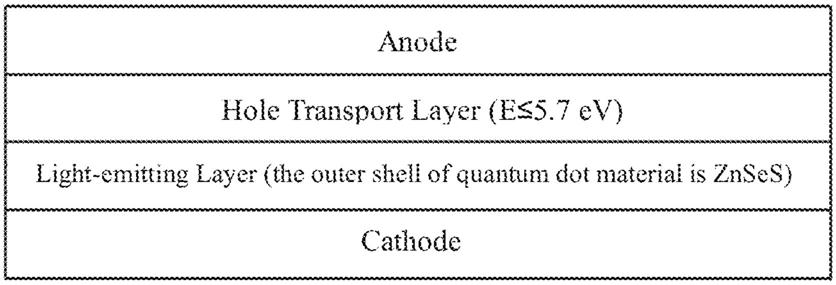
FIG. 9 is a schematic structural diagram of a photoelectric device according to a ninth aspect of the present application.

As shown in FIG. 9, a ninth aspect of the embodiments of the present application provides a photoelectric device, including a quantum dot light-emitting layer and a hole transport layer, the quantum dot light-emitting layer contains a quantum dot material of a core-shell structure, and an outer shell the quantum dot material] is ZnSeS. An absolute value of the maximum energy level of valence band of the hole transport material in the hole transport layer is smaller than or equal to 5.7 eV.

In the photoelectric device according to the ninth aspect of the present application, the structure of the photoelectric device is designed on the premise that the outer shell of the quantum dot material is specifically ZnSeS, and according to the energy level and other characteristics of ZnSeS. Specifically, since the outer shell of the quantum dots in this embodiment uses ZnSeS, and the energy level of valence band of ZnSeS is between ZnSe and ZnS, to construct a hole injection barrier having a difference in maximum energy level of valence band ($\Delta E_{EML-HTL}$) being greater than or equal to 0.5 eV, the maximum energy level of valence band of the hole transport material needs to be smaller than or equal to 5.7 eV. Through a construction of the hole injection barrier, the rate of hole injection is reduced, the equilibrium in injection efficiency of electrons and holes in the light-emitting layer is realized, the carrier accumulation is reduced, and the luminous efficiency is improved.

In some embodiments, the ZnSeS outer shell has a thickness of 1.0-4.0 nm. Since the easily oxidized Se in the ZnSeS outer shell is closer to the surface of the quantum dots, the ZnSeS outer shell needs to be thicker to ensure sufficient protection and passivation for the inner core. Thus, the thickness of the ZnSeS outer shell is in a range of 1.0-4.0 nanometers.

In some embodiments, the absolute value of the maximum energy level of valence band of the hole transport material is in a range of 4.9-5.7 eV, within this range, a more suitable hole injection barrier can be constructed with the ZnSeS outer shell material, and the carrier injection and recombination efficiency in the light-emitting layer can be optimized. In some embodiments, the absolute value of the maximum energy level of valence band of the hole transport material is in a range of 4.9-5.4 eV.

In some embodiments, the difference in maximum energy level of valence band between the ZnSeS material and the hole transport material is in a range of 0.9-1.4 eV. In the embodiments of the present application, the difference in maximum energy level of valence band ($\Delta E_{EML-HTL}$) of the hole transport layer material and the quantum dot outer shell material in the quantum dot light-emitting layer is in a range of 0.9-1.4 eV, which can not only ensure the efficiency of carrier injection into the light-emitting quantum dots through the tunneling effect, but also enables a better equilibrium in injection efficiency of holes and electrons. If the $\Delta E_{EML-HTL}$ is too large, the efficiency of carrier injection into the inner core of the light-emitting quantum dots through the tunneling effect is reduced. If the $\Delta E_{EML-HTL}$ is too small, the injection rate of holes will not be well regulated.

In some embodiments, the luminescence peak wavelength of the quantum dot material is in a range of 400-700 nm. In the embodiments of the present application, ZnSeS has a relatively strong binding ability to the excitons in the inner core of the quantum dots, which can effectively ensure the luminous efficiency of the quantum dot material itself, and is suitable for all quantum dot materials having a luminous peak wavelength of 400-700 nm in the visible light region. Thus, the present has a wide range of applications.

In some embodiments, due to the deep maximum energy level of valence band (smaller than or equal to 5.7 eV) of the hole transport material used in the embodiments of the present application, the hole mobility is relatively low, and the mobility of the hole transport material is higher than $1\times10^{-4}$ $cm^2/Vs$. In some embodiments, the mobility of the hole transport material is higher than $1\times10^{-3}$ $cm^2/Vs$.

In the photoelectric devices according to the sixth to ninth aspects of the present application, the hole transport material includes at least one of polymers containing aniline groups and copolymers containing fluorene groups and aniline groups. In practical applications, hole transport materials having suitable mobility may be selected according to specific application requirements.

In some embodiments, the polymers containing aniline groups, whose absolute value of the maximum energy level of valence band of the hole transport material is smaller than or equal to 5.4 eV, include: poly-TPD, P9, TFB, and P13.

In some embodiments, the copolymers containing fluorene groups and aniline groups, whose absolute value of the maximum energy level of valence band of the hole transport material is smaller than or equal to 5.4 eV, include: TFB, P13.

In some embodiments, the polymers containing aniline groups, whose absolute value of the maximum energy level of valence band of the hole transport material is greater than 5.4 eV and smaller than or equal to 5.9 eV, include: P11, P12, and P15.

In some embodiments, the copolymers containing fluorene groups and aniline groups, whose absolute value of the maximum energy level of valence band of the hole transport material is greater than 5.4 eV and smaller than or equal to 5.9 eV, include: P12, P15.

In the photoelectric devices according to the sixth to ninth aspects of the present application, the quantum dot material of the core-shell structure includes the above-mentioned outer shell, and also includes an inner core, and an intermediate shell between the inner core and the outer shell. The maximum energy level of valence band of the inner core material is shallower than the maximum energy level of valence band of the outer shell material. The maximum energy level of valence band of the intermediate shell material is between the maximum energy level of valence band of the core material and the maximum energy level of valence band of the outer shell material.

In some embodiments, the inner core material includes at least one of semiconductor compounds of II-IV group, II-VI group, II-V group, III-V group, III-VI group, IV-VI group, I-III-VI group, II-IV-VI group and II-IV-V group in the periodic table of elements. In some specific embodiments, the inner core material includes at least one of CdSe, CdZnSe, CdSeS, CdZnSeS, InP, InGaP, GaP, ZnTe, and ZnTeSe. These inner core materials have good luminescence properties, and have a good coordination effect with the outer shell ZnSe, ZnS, CdZnS or ZnSeS.

In some specific embodiments, the intermediate shell material includes at least one of CdZnSe, ZnSe, CdZnS, CdZnSeS, CdS, and CdSeS. The collocation principle of the intermediate shell in the embodiment of the present application is that: the composition of the intermediate shell should preferably form a continuous and natural transition from the inner core to the outer shell, which helps to realize the least lattice mismatch and the least lattice defects among the inner core, the intermediate shell, and the outer shell, so as to achieve the optimal luminescence performance of the core-shell quantum dot material itself. The intermediate shell generally needs to form a stepped energy level transition from the inner core to the outer shell, which helps to achieve efficient carrier injection, effective binding, and reduced flickering of the lattice interface.

In the photoelectric devices according to the sixth to ninth aspects of the present application, the optimization of the hole injection functional layer in the photoelectric devices of the second or third aspects may also be combined, and a first hole injection layer may be included. The absolute value of the difference between the work function of the first hole injection material in the first hole injection layer and the maximum energy level of valence band of the hole transport material is smaller than or equal to 0.2 eV. Alternatively, a second hole injection layer may be included, the difference between the maximum energy level of valence band of the material of the hole transport layer and the work function of the second hole injection material in the second hole injection layer is smaller than −0.2 eV. By improving the hole utilization rate in the device, and finely regulating the rate of hole injection, the equilibrium of carrier injection in the device is realized, the recombination efficiency is improved, and meanwhile, the impact of charge accumulation at the interfaces on the lifetime of the device is reduced.

In the photoelectric devices according to the sixth to ninth aspects of the present application, an electron transport layer may also be included, and the electron transport layer includes at least two sub-electron transport layers arranged to be laminated. Where, the at least one sub-electron transport layer contains a metal oxide compound transport material. Alternatively, the at least one sub-electron transport layer contains an organic transport material. Alternatively, a sub-electron transport layer containing a metal oxide compound transport material and a sub-electron transport layer containing an organic transport material are both included in the electron transport layer.

Figure 10:
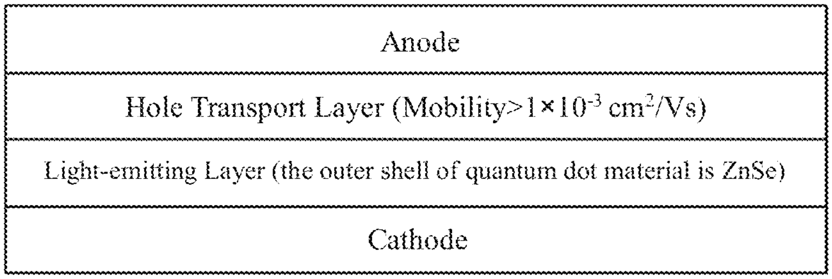
FIG. 10 is a schematic structural diagram of a photoelectric device according to a tenth aspect of the present application.

As shown in FIG. 10, a tenth aspect of the embodiment of the present application provides a photoelectric device, including a quantum dot light-emitting layer and a hole transport layer, the quantum dot light-emitting layer contains a quantum dot material of a core-shell structure, the outer shell of the quantum dot material is ZnSe, and the mobility of the hole transport material in the hole transport layer is higher than $1\times10^{-3}$ $cm^2/Vs$.

In the photoelectric device according to the tenth aspect of the present application, since the valence band energy level of the ZnSe outer shell material is relatively shallow (the absolute value of the energy level is small), the band gap is relatively narrow, and the binding ability to the excitons in the core-shell of the quantum dot structure is relatively poor. To ensure the good luminous efficiency of the quantum dot light-emitting material itself, a thicker ZnSe outer shell may be required, and the rate of injection into the light-emitting quantum dots through the tunneling effect will be decreased. For the quantum dot layer whose outer shell is ZnSe, in order to meet the construction of the hole injection barrier between the quantum dot outer shell in the HTL and the quantum dot outer shell in the EML, $\Delta E_{EML-HTL}>0.5$ eV, the EML needs to be matched with a HTL material having high hole mobility, higher than $1\times10^{-3}$ $cm^2/Vs$, to compensate the influence of tunneling effect on the rate of hole injection, equilibrate the injection efficiency of electrons and holes in the light-emitting layer, reduce the accumulation of carriers, and improve the luminous efficiency.

In some embodiments, in the quantum dot material, the ZnSe outer shell has a thickness of 2-5 nm. In the embodiments of the present application, since the band gap of ZnSe is relatively narrow, the ability to bind the excitons in the inner core of the quantum dots is relatively poor. To ensure the good luminous efficiency of the core-shell quantum dot light-emitting material itself, a thicker ZnSe outer shell is required, and thickness of the outer shell is in a range of 2.0-5.0 nanometers. If the thickness of the outer shell is too large, the rate of carrier injection into the light-emitting quantum dots through the tunneling effect will be decreased. The rate of carrier injection into the light-emitting quantum dots through the tunneling effect will be increased when the thickness of the outer shell becomes small. However, when the thickness of the outer shell becomes too small, the structure of the outer shell is unable to sufficiently protect and passivate the inner core, which thus affects the luminescence performance and stability of the quantum dot material.

In some embodiments, the luminescence peak wavelength of the quantum dot material is in a range of 510-640 nm. For the blue core-shell quantum dots having a shorter emission wavelength and a wider band gap in the inner core of quantum dots, even if a thick ZnSe outer shell is used, the luminous efficiency of the quantum dot material itself cannot be fully guaranteed. Thus, in the embodiments of the present application, the quantum dots light-emitting material should be red or green quantum dots having a luminous peak wavelength range of 510-640 nanometers, so as to better ensure the luminous efficiency of the quantum dots.

In some embodiments, the difference in maximum energy level of valence band between the ZnSe material and the hole transport material is in a range of 0.5-1.0 eV. In the embodiments of the present application, due to the thicker ZnSe outer shell, the rate of carrier injection into the light-emitting quantum dots through the tunneling effect will be decreased, and correspondingly, the difference in maximum energy level of valence band ($\Delta E_{EML-HTL}$) between the hole transport layer material and the quantum dot outer shell material should not be too large, and the range of $\Delta E_{EML-HTL}$ should be between 0.5 eV and 1.0 eV. If $\Delta E_{EML-HTL}$ is too large, the efficiency of hole injection into the quantum dot light-emitting core will be reduced, which will affect the luminous efficiency of the quantum dot material.

In some embodiments, the absolute value of the maximum energy level of valence band of the hole transport material is in a range of 4.9 eV to 5.4 eV, within this range, a more suitable hole injection barrier can be constructed with the ZnSe outer shell material, and the carrier injection and recombination efficiency in the light-emitting layer can be optimized.

Figure 11:
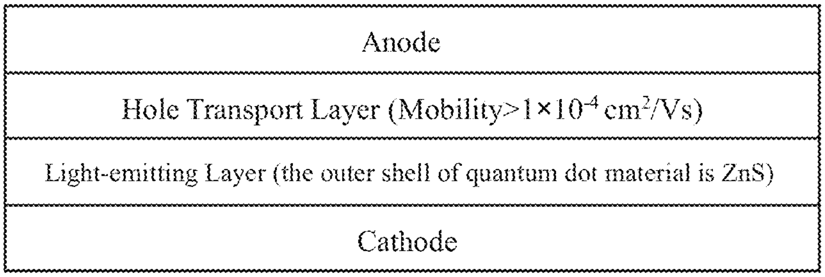
FIG. 11 is a schematic structural diagram of a photoelectric device according to an eleventh aspect of the present application.

As shown in FIG. 11, an eleventh aspect of the embodiment of the present application provides a photoelectric device, including a quantum dot light-emitting layer and a hole transport layer, the quantum dot light-emitting layer contains a quantum dot material of a core-shell structure, the outer shell of the quantum dot material is ZnS, and the mobility of the hole transport material in the hole transport layer is higher than $1\times10^{-4}$ $cm^2/Vs$.

In the photoelectric device according to the eleventh aspect of the present application, when ZnS is used as the quantum dot outer shell material, since ZnS has a wider band gap, the binding ability to the excitons in the core-shell quantum dot structure is strong, the good luminous efficiency of the light-emitting quantum dot material itself can be basically guaranteed by using a thinner ZnS outer shell. Thereby, the rate of carrier injection into the light-emitting quantum dot through the tunneling effect will be increased. The hole mobility of the hole transport material used is greater than or equal to $1\times10^{-4}$ $cm^2/Vs$, which can simultaneously realize the hole injection barrier having a difference in maximum energy level of valence band between the outer shell material of the quantum dot material and the hole transport material being greater than or equal to 0.5 eV, i.e., $\Delta E_{EML-HTL}$20.5 eV, and ensure the efficiency of hole transport and injection into the quantum dot material.

In some embodiments, the ZnS outer shell has a thickness of 0.2-2.0 nm. In the embodiments of the present application, due to the wider band gap of ZnS, the binding ability to the excitons in the inner core of the quantum dots is strong, so the use of a thinner ZnS outer shell can basically ensure the good luminous efficiency of the light-emitting quantum dot material itself, and the thickness of the outer shell is in a range of 0.2-2.0 nanometers. Meanwhile, the thin ZnS outer shell can also effectively reduce the overall resistance of the device, reduce the driving voltage of the device and improve the performance of the device.

In some embodiments, the absolute value of the maximum energy level of valence band of the hole transport material is in a range of 4.9 eV to 6.0 eV, and within this range, a more suitable hole injection barrier can be constructed with the ZnS outer shell material, and the carrier injection and recombination efficiency in the light-emitting layer can be optimized. In some embodiments, the absolute value of the maximum energy level of valence band of the hole transport material is in a range of 4.9 eV to 5.5 eV.

In some embodiments, the difference in maximum energy level of valence band between the ZnS material and the hole transport material is in a range of 1.0-1.6 eV. In the embodiments of the present application, since the ZnS outer shell has a thinner thickness, the rate of carrier injection into the light-emitting quantum dot through the tunneling effect will be increased, and correspondingly, the difference in maximum energy level of valence band ($\Delta E_{EML-HTL}$) between the hole transport layer material and the quantum dot outer shell material in the quantum dot light-emitting layer needs to be appropriately increased, so as to enable a better equilibrium in injection of holes and electrons, and $\Delta E_{EML-HTL}$ should be in a range of 1.0-1.6 eV. If $\Delta E_{EML-HTL}$ is too large, the efficiency of hole injection into the inner core of the light-emitting quantum dots will be reduced, which will affect the luminous efficiency of the quantum dot material.

In some embodiments, the luminescence peak wavelength of the quantum dot material is in a range of 400-700 nm. In the embodiments of the present application, due to the wider band gap of ZnS, the binding ability to the excitons in the inner core of the quantum dots is strong, which can effectively ensure the luminous efficiency of the quantum dot material itself, and is suitable for all of the quantum dot materials having a luminous peak wavelength of 400-700 nm in the visible light region. Thus, the present application has a wide range of applications.

In some embodiments, the mobility of the hole transport material is higher than $1\times10^{-3}$ $cm^2/Vs$.

Figure 12:
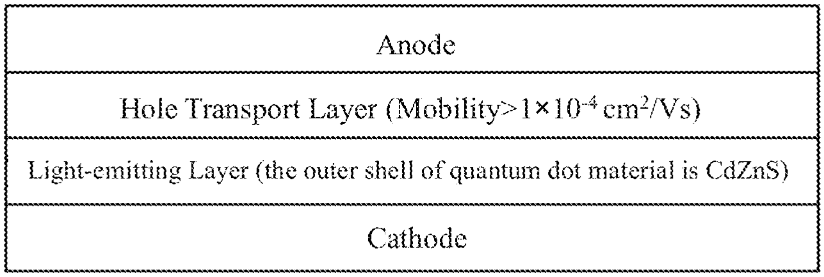
FIG. 12 is a schematic structural view of the photoelectric device according to a twelfth aspect of the present application.

As shown in FIG. 12, a twelfth aspect of the embodiment of the present application provides a photoelectric device, including a quantum dot light-emitting layer and a hole transport layer, the quantum dot light-emitting layer contains a quantum dot material of a core-shell structure, the outer shell of the quantum dot material is CdZnS, and the mobility of the hole transport material in the hole transport layer is higher than $1\times10^{-4}$ $cm^2/Vs$.

In the photoelectric device according to the twelfth aspect of the present application, the outer shell of the quantum dots is made of CdZnS, the band gap width of CdZnS is between ZnSe and ZnS, and the ability to bind excitons in the core-shell structure of the quantum dots is moderate. The relatively moderate CdZnS outer shell thickness can basically guarantee the good luminous efficiency of the light-emitting quantum dot material itself, so the thickness of the outer shell has little influence on the tunneling effect of the carriers. At the same time, the energy level of valence band of the CdZnS outer shell material is between ZnSe and ZnS. To construct a hole injection barrier having a difference in maximum energy level of valence band ($\Delta E_{EML-HTL}$) being greater than or equal to 0.5 eV, the maximum energy level of valence band of the hole transport material required is relatively shallow. Thus, once the hole mobility of the HTL material is greater than or equal to $1\times10^{-4}$ $cm^2/Vs$, the construction of a hole injection barrier of $\Delta E_{EML-HTL}$20.5 eV can be meet and meanwhile, the efficiency of hole transport and injection into the quantum dot material can be ensured.

In some embodiments, the CdZnS outer shell has a thickness of 0.5-3.0 nm. Since the band gap of CdZnS is between ZnSe and ZnS, when the thickness of the outer shell is in a range of 0.5-3.0 nm, the binding ability to the excitons in the inner core of the quantum dots, and the good luminous efficiency of the light-emitting quantum dot material itself can be simultaneously guaranteed.

In some embodiments, the absolute value of the maximum energy level of valence band of the hole transport material is in a range of 4.9-5.9 eV, within this range, a more suitable hole injection barrier can be constructed with the CdZnS outer shell material, and the carrier injection and recombination efficiency in the light-emitting layer can be optimized. In some embodiments, the absolute value of the maximum energy level of valence band of the hole transport material is in a range of 4.9-5.5 eV.

In some embodiments, the difference in maximum energy level of valence band between the CdZnS material and the hole transport material is in a range of 0.8-1.4 eV. In the embodiments of the present application, the difference in maximum energy level of valence band ($\Delta E_{EML-HTL}$) between the hole transport layer material of and the quantum dot outer shell material in the quantum dot light-emitting layer is in a range of 0.8-1.4 eV, which not only can ensure the efficiency of carrier injection into the light-emitting quantum dots through the tunneling effect, but also enables a better equilibrium in injection efficiency of holes and electrons. If the $\Delta E_{EML-HTL}$ is too large, the efficiency of carrier injection into the inner core of the light-emitting quantum dots through the tunneling effect will be reduced. If the $\Delta E_{EML-HTL}$ is too small, the injection rate of holes will not be regulated well.

In some embodiments, the luminescence peak wavelength of the quantum dot material is in a range of 400-700 nm. In the embodiment of the present application, CdZnS has a relatively strong binding ability to the excitons in the inner core of the quantum dots, which can effectively ensure the luminous efficiency of the quantum dot material itself, and is suitable for all quantum dot materials having a luminous peak wavelength of 400-700 nm in the visible light region. Thus, the present application has a wide range of applications.

In some embodiments, the mobility of the hole transport material is higher than $1\times10^{-3}$ $cm^2/Vs$.

Figure 13:
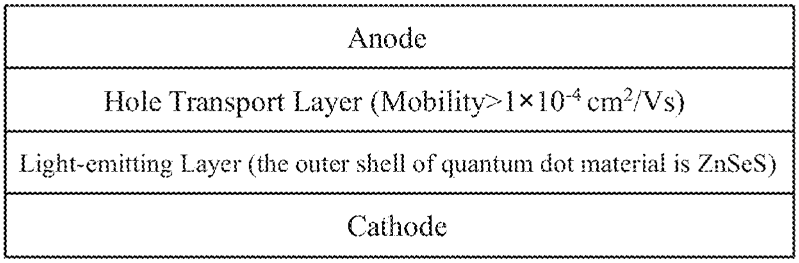
FIG. 13 is a schematic structural view of the photoelectric device according to a thirteenth aspect of the present application.

As shown in FIG. 13, a thirteenth aspect of the embodiment of the present application provides a photoelectric device, including a quantum dot light-emitting layer and a hole transport layer, the quantum dot light-emitting layer contains a quantum dot material of a core-shell structure, the outer shell of the quantum dot material is ZnSeS, and the mobility of the hole transport material in the hole transport layer is higher than $1\times10^{-4}$ $cm^2/Vs$.

In the photoelectric device according to the thirteenth aspect of the present application, the outer shell of the quantum dots is made of ZnSeS, and the band gap width of ZnSeS is between ZnSe and ZnS, and the binding ability for the excitons in the core-shell structure of the quantum dots is moderate. The outer shell has little influence on the tunneling effect of carriers. At the same time, the energy level of valence band of the ZnSeS outer shell material is between ZnSe and ZnS. To construct a hole injection barrier having a difference in maximum energy level of valence band ($\Delta E_{EML-HTL}$) being greater than or equal to 0.5 eV, the maximum energy level of valence band of the hole transport material required is relatively shallow. Thus, when the hole mobility of the HTL material is greater than or equal to $1\times10^{-3}$ $cm^2/Vs$, the construction of the hole injection barrier can be satisfied, and meanwhile the efficiency of hole transport and injection into the quantum dot material can be guaranteed.

In some embodiments, the ZnSeS outer shell has a thickness of 1.0-4.0 nm. Since the easily oxidized Se in the ZnSeS outer shell is closer to the surface of the quantum dots, the ZnSeS outer shell needs to be thicker to ensure sufficient protection and passivation for the inner core. Thus, the thickness of the ZnSeS outer shell is in the range of 1.0-4.0 nanometers.

In some embodiments, the absolute value of the maximum energy level of valence band of the hole transport material is in a range of 4.9-5.7 eV, within this range, a more suitable hole injection barrier can be constructed with the ZnSeS outer shell material, and the carrier injection and recombination efficiency in the light-emitting layer can be optimized. In some embodiments, the absolute value of the maximum energy level of valence band of the hole transport material is in a range of 4.9-5.4 eV.

In some embodiments, the difference in maximum energy level of valence band between the ZnSeS material and the hole transport material is in a range of 0.9-1.4 eV. In the embodiments of the present application, the difference in maximum energy level of valence band ($\Delta E_{EML-HTL}$) of the hole transport layer material and the quantum dot outer shell material in the quantum dot light-emitting layer is in the range of 0.9-1.4 eV, which not only can ensure the efficiency of carrier injection into the light-emitting quantum dots through the tunneling effect, but also enables a better equilibrium in injection efficiency of holes and electrons. If the $\Delta E_{EML-HTL}$ is too large, the efficiency of carrier injection into the inner core of the light-emitting quantum dots through the tunneling effect will be reduced. If the $\Delta E_{EML-HTL}$ is too small, the injection rate of holes will not be regulated well.

In some embodiments, the luminescence peak wavelength of the quantum dot material is in a range of 400-700 nm. In the embodiments of the present application, ZnSeS has a relatively strong binding ability to the excitons in the inner core of the quantum dots, which can effectively ensure the luminous efficiency of the quantum dot material itself, and is suitable for all of the quantum dot materials having a luminous peak wavelength of 400-700 nm in the visible light region. Thus, the present application has a wide range of applications.

In some embodiments, the mobility of the hole transport material is higher than $1\times10^{-3}$ $cm^2/Vs$.

In the photoelectric devices according to the tenth to thirteenth aspects of the present application, the hole transport material includes at least one of polymers containing aniline groups and copolymers containing fluorene groups and aniline groups. In practical applications, hole transport materials having suitable mobility may be selected according to the specific application requirements.

In some embodiments, the polymers containing aniline groups, whose mobility of a hole transport material is higher than $1\times10^{-3}$ $cm^2/Vs$, include poly-TPD, TFB, P9, P11, and P13.

In some embodiments, the copolymers containing fluorene groups and aniline groups, whose mobility of a hole transport material is higher than $1\times10^{-3}$ $cm^2/Vs$, include: TFB, P13.

In some embodiments, the polymers containing aniline groups, whose mobility of a hole transport material is higher than $1\times10^{-4}$ $cm^2/Vs$, include: poly-TPD, TFB, P9, P11, P13, and P15.

In some embodiments, the copolymers containing fluorene groups and aniline groups whose mobility of the hole transport material is higher than $1\times10^{-4}$ $cm^2/Vs$, include: TFB, P13, P15.

In the photoelectric devices according to the tenth to thirteenth aspects of the present application, the quantum dot material of the core-shell structure also includes an inner core, and an intermediate shell between the inner core and the outer shell. The maximum energy level of valence band of the inner core material is shallower than the maximum energy level of valence band of the outer shell material. The maximum energy level of valence band of the intermediate shell material is between the maximum energy level of valence band of the core material and the maximum energy level of valence band of the outer shell material.

In some embodiments, the inner core material includes at least one of semiconductor compounds of II-IV group, II-VI group, II-V group, III-V group, III-VI group, IV-VI group, I-III-VI group, II-IV-VI group and II-IV-V group in the periodic table of elements. In some specific embodiments, the inner core material includes at least one of CdSe, CdZnSe, CdSeS, CdZnSeS, InP, InGaP, GaP, ZnTe, and ZnTeSe. These inner core materials have good luminescence properties, and have a good coordination effect with the outer shell ZnSe, ZnS, CdZnS or ZnSeS.

In some specific embodiments, the intermediate shell material includes at least one of CdZnSe, ZnSe, CdZnS, CdZnSeS, CdS, and CdSeS. The collocation principle of the intermediate shell in the embodiment of the present application is as follows: the composition of the intermediate shell should preferably form a continuous and natural transition from the inner core to the outer shell, which helps to realize the least lattice mismatch and the least lattice defects among the inner core, the intermediate shell, and the outer shell, so as to achieve the optimal luminescence performance of the core-shell quantum dot material itself. The intermediate shell generally needs to form a stepped energy level transition from the inner core to the outer shell, which helps to achieve efficient carrier injection, effective binding, and reduced flickering of the lattice interface.

In the photoelectric devices according to the tenth to thirteenth aspects of the present application, the optimization of the hole injection functional layer in the photoelectric devices in the second or third aspects above can also be combined, and a first hole injection layer may be included. The absolute value of the difference between the work function of the first hole injection material in the first hole injection layer and the maximum energy level of valence band of the hole transport material is smaller than or equal to 0.2 eV. Alternatively, a second hole injection layer may be included, the difference between the maximum energy level of valence band of the material of the hole transport layer and the work function of the second hole injection material in the second hole injection layer is smaller than −0.2 eV. By improving the hole utilization rate in the device, and finely regulating the rate of hole injection, the equilibrium of carrier injection in the device is realized, the recombination efficiency is improved, and meanwhile, the impact of charge accumulation at the interfaces on the lifetime of the device is reduced.

In the photoelectric devices according to the tenth to thirteenth aspects of the present application, an electron transport layer may also be included, and the electron transport layer includes at least two sub-electron transport layers arranged to be laminated. Where, the at least one sub-electron transport layer contains a metal oxide compound transport material. Alternatively, the at least one sub-electron transport layer contains an organic transport material. Alternatively, a sub-electron transport layer containing a metal oxide compound transport material and a sub-electron transport layer containing an organic transport material are both included in the electron transport layer.

In the above embodiments of the present application, the structure of the device will be not limited in here, and the photoelectric device may be a device of a positive structure or a device of an inverse structure.

Figure 14:
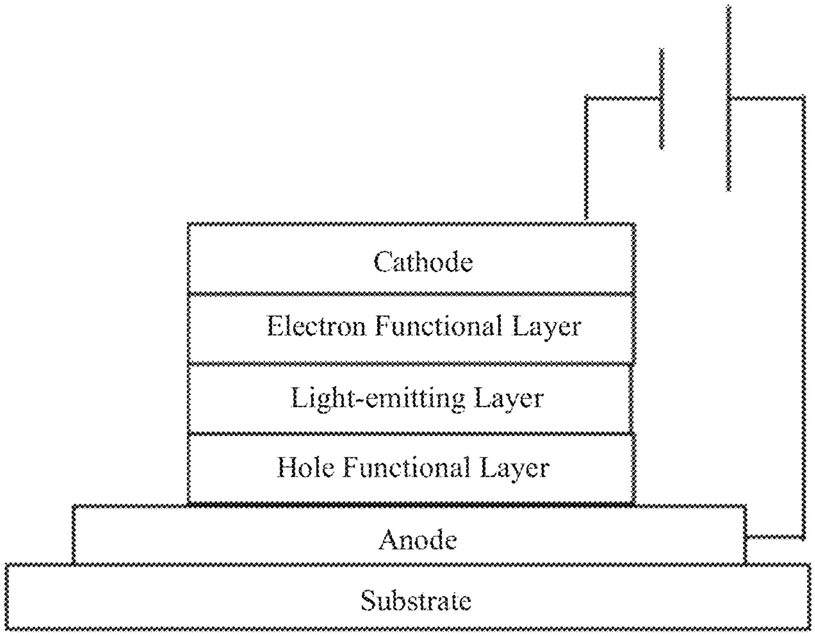
FIG. 14 is a schematic diagram of a positive structure of a quantum dot light-emitting diode according to an embodiment of the present application.

In one embodiment, the photoelectric device of a positive structure includes a laminated structure, as shown in FIG. 14, an anode and a cathode are disposed opposite to each other, a light-emitting layer is disposed between the anode and the cathode, and the anode is disposed on a substrate. Hole functional layers such as a hole injection layer and a hole transport layer may also be disposed between the anode and the light-emitting layer. Electronic functional layers such as an electron transport layer and an electron injection layer may also be disposed between the cathode and the light-emitting layer. In some specific embodiments of the positive structure device, the photoelectric device includes a substrate, an anode disposed on a surface of the substrate, a hole transport layer disposed on a surface of the anode, a light-emitting layer disposed on a surface of the hole transport layer, an electron transport layer disposed on a surface of the light emitting layer, and a cathode provided on a surface of the electron transport layer.

Figure 15:
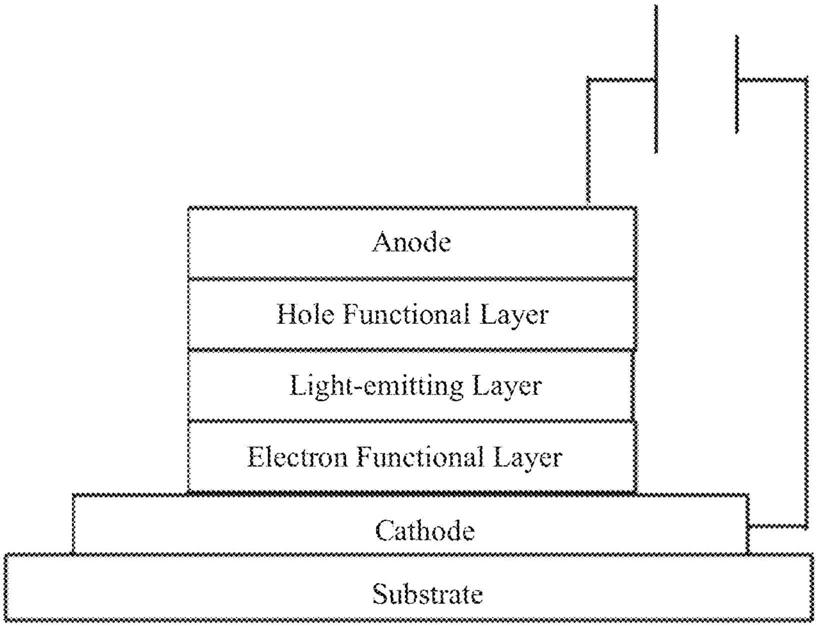
FIG. 15 is a schematic diagram of an inverse structure of a quantum dot light-emitting diode according to an embodiment of the present application.

In one embodiment, the photoelectric device of an inverse structure includes a laminated structure, as shown in FIG. 15, an anode and a cathode disposed opposite to each other, a light-emitting layer is disposed between the anode and the cathode, and the cathode is disposed on a substrate. Hole functional layers such as a hole injection layer and a hole transport layer may also be disposed the anode and the light-emitting layer. Electron functional layers such as an electron transport layer and an electron injection layer may also be disposed between the cathode and the light-emitting layer. In some embodiments of the inverse structure device, the photoelectric device includes a substrate, a cathode disposed on a surface of the substrate, an electron transport layer disposed on a surface of the cathode, a light-emitting layer disposed on a surface of the electron transport layer, a hole transport layer disposed on a surface of the light-emitting layer, and an anode disposed on a surface of the hole transport layer.

In some embodiments, the selection of the substrate is not limited, and a rigid substrate or a flexible substrate may be used. In some specific embodiments, the rigid substrate includes, but is not limited to, one or more of glass and metal foil. In some specific embodiments, the flexible substrate includes, but is not limited to, one or more of polyethylene terephthalate (PET), polyethylene terephthalate (PEN), polyether ether ketone (PEEK), polystyrene (PS), polyethersulfone (PES), polycarbonate (PC), polyaryl ester (PAT), polyarylate (PAR), polyimide (PI), polyvinyl chloride (PV), polyethylene (PE), polyvinylpyrrolidone (PVP), and textile fibers.

In some embodiments, the selection of anode material is not limited, and the anode material may be selected from doped metal oxides, including but not limited to, one or more of indium doped tin oxide (ITO), fluorine doped tin oxide (FTO), antimony doped tin oxide (ATO), aluminum doped zinc oxide (AZO), gallium doped zinc oxide (GZO), indium doped zinc oxide (IZO), magnesium doped zinc oxide (MZO), aluminum doped magnesium oxide (AMO). The anode material may also be selected from composite electrodes having a metal sandwiched between doped or non-doped transparent metal oxides, including but not limited to one or more of AZO/Ag/AZO, AZO/Al/AZO, ITO/Ag/ITO, ITO/Al/ITO, ZnO/Ag/ZnO, ZnO/Al/ZnO, $TiO_2$/Ag/$TiO_2$, $TiO_2$/Al/$TiO_2$, ZnS/Ag/ZnS, ZnS/Al/ZnS, $TiO_2$/Ag/$TiO_2$, $TiO_2$/Al/$TiO_2$.

In some embodiments, the cathode material may be one or more of various conductive carbon materials, conductive metal oxide materials, and metal materials. In some specific embodiments, the conductive carbon material includes, but is not limited to, doped or undoped carbon nanotube, doped or undoped graphene, doped or undoped graphene oxide, C60, graphite, carbon fibers, porous carbon, or mixtures thereof. In some embodiments, the conductive metal oxide material includes, but is not limited to, ITO, FTO, ATO, AZO, or mixtures thereof. In some specific embodiments, the metal material includes, but is not limited to, Al, Ag, Cu, Mo, Au, or alloys thereof, and a morphology of the above metal material includes but not limited to dense film, nanowire, nanosphere, nanometer Rods, nano cones, nano hollow spheres, or a combination thereof. The cathode is Ag or Al.

In some embodiments, the quantum dot light-emitting layer has a thickness of 8-100 nm. In some embodiments, the hole transport layer has a thickness of 10-150 nm. In some embodiments, the electron transport layer has a thickness of 10-200 nm. In practical applications, the electronic functional layer, light-emitting layer, and hole functional layer in the device may be designed having appropriate thicknesses according to the characteristics of the devices in the above embodiments.

A preparation of the photoelectric device in an embodiment of the present application includes steps S10 to S50.

In step S10, a substrate deposited with an anode is obtained.

In step S20, a hole injection layer is grown on a surface of the anode.

In step S30, a hole transport layer is grown on a surface of the hole injection layer.

In step S40, a quantum dot light-emitting layer is then deposited on the hole transport layer.

In step S50, an electron transport layer is deposited on the quantum dot light-emitting layer, and a cathode is evaporated on the electron transport layer to obtain a photoelectric device.

Specifically, in step S10, an ITO substrate needs to undergo a pretreatment process, which includes steps of: cleaning an ITO conductive glass with a detergent to initially remove stains existing on the surface, and then performing ultrasonic cleaning on the ITO conductive glass in deionized water, acetone, absolute ethanol, and deionized water successively for 20 minutes, respectively, to remove impurities on the surface, and finally drying the ITO conductive glass with high-purity nitrogen, and then an ITO positive electrode is obtained.

Specifically, in step S20, the step of growing the hole injection layer includes: preparing a metal oxide and other materials into a thin film in the QLED device by means of a solution approach, a vacuum sputtering approach, and a vacuum evaporation approach; Where, the solution approach includes an inkjet printing, a spin coating, a spray printing, a slot-die printing or a screen printing, etc.

Specifically, in step S30, the step of growing the hole transport layer includes: placing the ITO substrate on a spin coater, and spin-coating the prepared hole transport material solution to form a film; and adjusting the concentration of the solution, the spin coating speed and spin coating time to control the film thickness, then performing a thermal annealing treatment at an appropriate temperature.

Specifically, in step S40, the step of depositing the quantum dot light-emitting layer on the hole transport layer includes: placing the substrate that has been spin-coated with the hole transport layer on a spin coater, and spin-coating the prepared solution having a certain concentration of the luminescent substance to form a film; and adjusting the concentration of the solution, the spin-coating speed and the spin-coating time to control the thickness of the light-emitting layer, about 20-60 nm, then performing a drying at an appropriate temperature.

Specifically, in step S50, the step of depositing the electron transport layer on the quantum dot light-emitting layer includes: placing the substrate that has been spin-coated with the quantum dot light-emitting layer on a spin coater, and spin-coating the prepared solution having a certain concentration of the electron transport composite material to form a film through a drip coating, a spin coating, a soaking, a coating, a printing, an evaporation or other processes; and adjusting the concentration of the solution, the spin coating speed (for example, a rotation speed is between 3000-5000 rpm) and the spin coating time to control the thickness of the electron transport layer, about 20-60 nm, and then performing an annealing treatment at a temperature of 150 °C to 200 °C to form the film, so as to fully remove the solvent.

Specifically, the step of preparing the cathode includes: placing the substrate on which each functional layer has been deposited in an evaporation chamber and thermally evaporating a layer of 60-100 nm metal silver or aluminum through a mask plate as the cathode.

In some embodiments, the method for preparing the photoelectric device also includes a step of encapsulating the photoelectric device prepared in layers. The curing resin used in the encapsulation is acrylic resin, acrylate resin or epoxy resin. The resin is cured by an UV irradiation, a heating or a combination thereof. The encapsulation process may adopt a commonly used machine encapsulation or a manual encapsulation. In the encapsulation environment, the oxygen content and water content are both lower than 0.1 ppm to ensure the stability of the device.

In some embodiments, the method for preparing the photoelectric device also includes introducing one or more processes including an ultraviolet irradiation, a heating, a positive and negative pressure, an applied electric field, and an applied magnetic field, after the photoelectric device is encapsulated. The atmosphere in which these processes are applied may be air or an inert atmosphere.

In order to enable the above implementation details and operations of the present application to be clearly understood by persons skilled in the art, and to significantly reflect the progressive performance of the photoelectric devices the embodiments of the present application, the above technical solutions are illustrated below through multiple embodiments.

The device in an embodiment of the application may adopt an ITO/HIL/HTL/QD/ETL/AL structure, and is subjected to a certain heat treatment after being encapsulated. The advantages of the technical solution of the application are explained in detail through a comparison of collocations of different functional layers in the device. In the following examples, the lifetime test adopts a constant current approach. Under a constant current drive of 50 $mA/cm^2$, the silicon photonics system is used to test a brightness variation of the device. The time LT95 is recorded when the brightness of the device starts from the highest point, decays to 95% of the highest brightness, and then the lifetime of the device 1000 nit LT95S is extrapolated by empirical formula. This method is convenient for comparing the lifetimes of devices with different brightness levels, and is widely used in practical photoelectric devices.

$$1000\ \text{nit LT95}=(L_{Max}/1000)^{1.7}\times \text{LT95}$$

A method for testing an energy level of each material in an embodiment of the present application includes steps of: spin-coating the material of each functional layer to form a film, and then performing an energy level test through an ultraviolet photoelectron spectroscopy (UPS, Ultraviolet Photoelectron Spectroscopy).

Work function $\Phi=hv-E_{cutoff}$, where hv is an energy of an incident excitation photon, and $E_{cutoff}$ is a cut-off position of an excited secondary electron.

Valence band maximum VB (Highest Occupied Molecular Orbital, HOMO): $E_{HOMO}=E^{F\text{-}HOMO}+\Phi$, where $E^{F\text{-}HOMO}$ is s difference between the HOMO (VB) and the Fermi level of the material, corresponding to a starting edge of a first peak that appears at the low binding energy end of the binding energy spectrum;

Conduction band minimum (LOMO): $E_{LOMO}=E^{HOMO}-E^{HOMO\text{-}LOMO}$, where $E^{HOMO\text{-}LOMO}$ is a band gap of the material, obtained through an ultraviolet absorption spectrum (UV-Vis).

Examples 1-7

To verify the influence of the hole injection barrier between the outer shell material of the quantum dot material and the hole transport material on the performance of the device, Examples 1 to 7 are provided in the present application to illustrate the effect of hole injection barrier on the lifetime and other performance of the device through a comparison of different collocations of HTL and QD.

Three type of quantum dots are used in Examples 1 to 7 of the present application, that is, a blue QD1 whose outer shell is CdZnS (an inner core is CdZnSe, an intermediate shell is ZnSe, the thickness of the outer shell is 1.5 nm, and the maximum energy level of the valence band is-6.2 eV), a blue QD2 whose outer shell is ZnS (an inner core is CdZnSe, an intermediate shell is ZnSe, the thickness of the ZnS outer shell is 0.3 nm, and the maximum energy level of the valence band is 6.5 eV), and a blue QD3 whose outer shell is ZnSeS (the inner core is CdZnSe, the intermediate shell is ZnSe). The hole transport materials are respectively P9 ($E_{HOMO}$: 5.1 eV), P11 ($E_{HOMO}$: 5.5 eV), P15 ($E_{HOMO}$: 5.8 eV), and the hole injection layer is made of PEDOT: PSS ($E_{HOMO}$: 5.1 eV), the electron transport layer is made of ZnO, as shown in Table 1 below:

TABLE 1

| Device No. | Outer Shell of Blue QD | Material of HIL | $\Delta E_{EML\text{-}HTL}$ (eV) | 1000 nit LT95 (hour) |
|---|---|---|---|---|
| Example 1 | CdZnS (6.2 eV) | P15 (5.8 eV) | 0.4 | 0.72 |
| Example 2 | CdZnS (6.2 eV) | P9 (5.1 eV) | 1.1 | 1.26 |
| Example 3 | ZnS (6.5 eV) | P15 (5.8 eV) | 0.7 | 6.29 |
| Example 4 | ZnSeS (6.3 eV) | P15 (5.8 eV) | 0.5 | 6.26 |
| Example 5 | ZnS (6.5 eV) | P11 (5.5 eV) | 1.0 | 11.82 |
| Example 6 | ZnS (6.5 eV) | P9 (5.1 eV) | 1.4 | 35.2 |
| Example 7 | ZnS (6.5 eV) | P13 (5.1 eV) | 1.6 | 31.2 |

Figure 16:
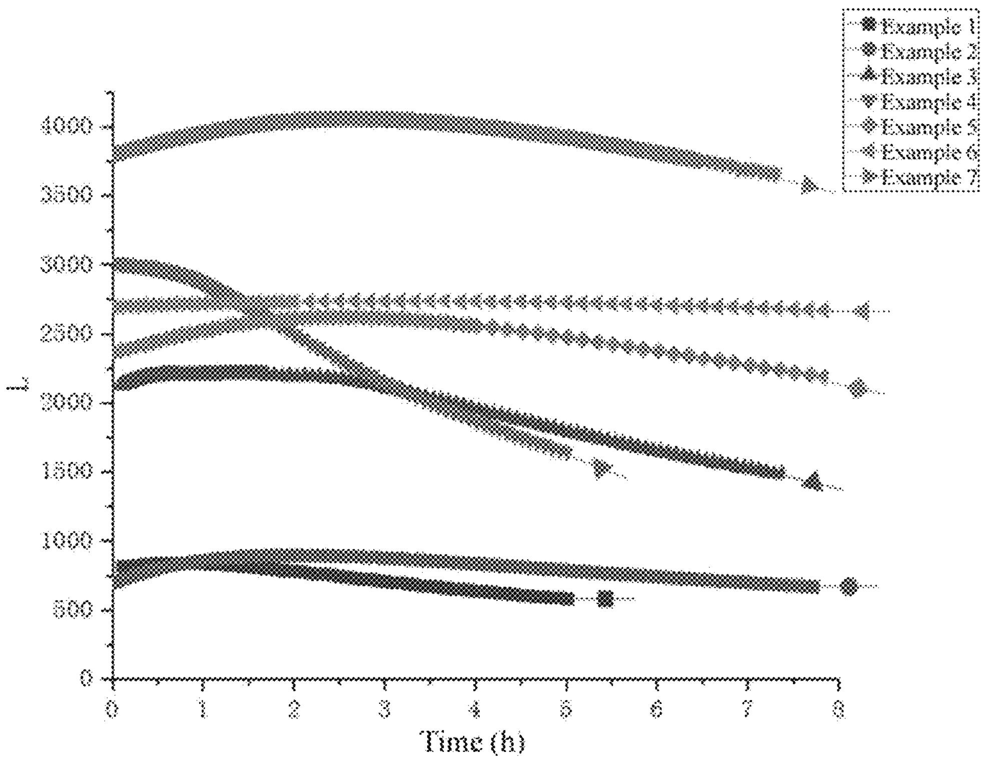
FIG. 16 is a graph showing test results of a luminous lifetime of quantum dot light-emitting diodes provided in Examples 1 to 7 of the present application.

From the test results in the above Table 1 and FIG. 16 (the abscissa is time and the ordinate is brightness), it can be seen that for quantum dots having the same CdZnS (6.2 eV) outer shell, the HTL is changed from P15 (5.8 eV) to P9 (5.1 eV), the barrier difference $\Delta E_{EML\text{-}HTL}$ increases from 0.4 eV to 1.1 eV, the device lifetime is improved, and the lifetime of 1000 nit LT95S is increased from 0.72 to 1.26. In addition, for the same P15 (5.8 eV) material, the different outer shells of the quantum dots from CdZnS (6.2 eV) to ZnS (6.5 eV), the barrier difference $\Delta E_{EML\text{-}HTL}$ increases from 0.4 eV to 0.7 eV, the device lifetime is significantly improved, and the lifetime of 1000 nit LT95S is increased from 0.72 to 6.29.

It can be seen that, no matter the HTL or EML material is regulated to increase the difference in maximum energy level of valence band $\Delta E_{EML\text{-}HTL}$ to be greater than 0.5 eV, the device injection equilibrium is optimized, and the device lifetime can be enhanced. It shows that the injection of holes and electrons in the light-emitting layer can be better balanced by increasing the hole injection barrier to reduce the efficiency of hole injection, and the luminous efficiency and luminous device lifetime can be improved.

Examples 8-11

To verify the influence of the energy-level barrier at the interface from HIL to HTL on the device performance, Examples 8-11 are provided in the present application to illustrate the effect of the hole injection barrier $\Delta E_{HTL\text{-}HIL}$ on the lifetime and other performance of the device through a comparison of different collocations of HTL and HTL.

In each of the Example 8-9 of the present application, a blue quantum dot whose outer shell is ZnS (an inner core is CdZnSe, an intermediate shell is ZnSe, the thickness of the outer shell is 0.3 nm, and the maximum energy level of the valence band is 6.5 eV) is adopted. In each of the Example 8-9, a red quantum dot whose outer shell is ZnS (an inner core is CdZnSe, an intermediate shell is ZnSe, the thickness of the outer shell is 0.3 nm, the maximum energy level of valence band is 6.5 eV) is adopted. The hole transport materials are respectively: P9 ($E_{HOMO}$: 5.5 eV), P11 ($E_{HOMO}$: 5.5 eV), P13 ($E_{HOMO}$: 4.9 eV), the hole injection layer is made of PEDOT: PSS ($E_{HOMO}$: 5.1 eV) and HIL2 (work function: 5.6 eV), and the electron transport layer is made of ZnO, as shown in Table 2 below.

TABLE 2

| Device No. | Outer Shell of Blue QD | HTL | HIL | $\Delta E_{HTL\text{-}HIL}$ (eV) | LT95 (h) |
|---|---|---|---|---|---|
| Example 8 | ZnS (6.5 eV) | P11 (5.5 eV) | PEDOT: PSS (5.1 eV) | 0.4 | 11.82 |
| Example 9 | ZnS (6.5 eV) | P13 (4.9 eV) | | −0.2 | 31.2 |
| **Device No.** | **Outer Shell of Red QD** | **HTL** | **HIL** | **$\Delta E_{HTL\text{-}HIL}$ (eV)** | **LT95 (h)** |
| Example 10 | ZnS (6.5 eV) | P9 (5.1 eV) | PEDOT: PSS (5.1 eV) | 0.0 | 1094.78 |
| Example 11 | ZnS (6.5 eV) | P9 (5.1 eV) | HIL2 (5.6 eV) | −0.5 | 12221.49 |

Note:
When $\Delta E_{HTL\text{-}HIL}$< 0.2 eV, under the existing HIL materials and experimental data, $\Delta E_{EML\text{-}HTL}$ must be greater than 0.5 eV.

Figure 17:
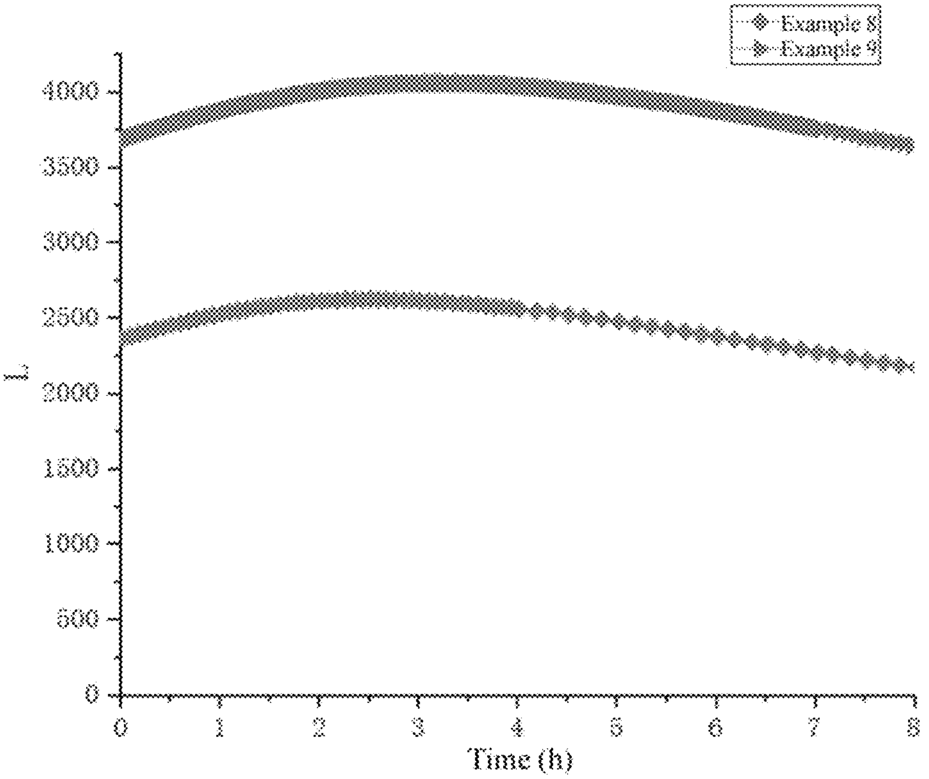
FIG. 17 is a graph showing test results of a luminous lifetime of quantum dot light-emitting diodes provided in Examples 8 to 9 of the present application.
Figure 18:
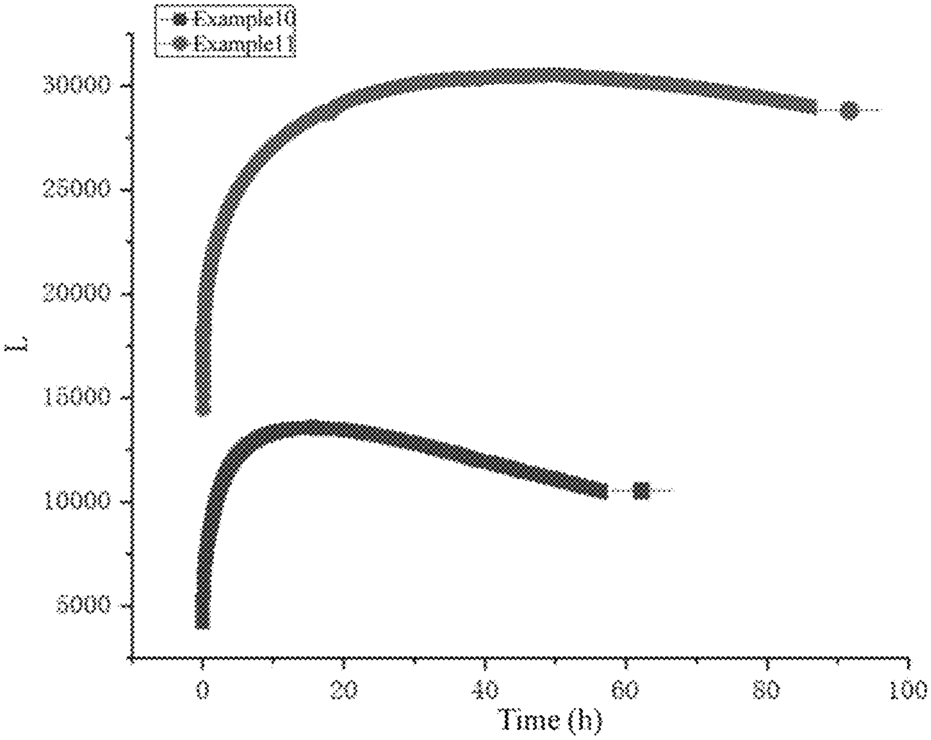
FIG. 18 is a graph showing test results of a luminous lifetime of quantum dot light-emitting diodes provided in Examples 10-11 of the present application.

From the test results of the above table 2 and FIGS. 17 and 18 (the abscissa is time and the ordinate is brightness), it can be seen that, compared with the Examples where $\Delta E_{HTL\text{-}HIL}$ is greater than or equal to −0.2 eV, the device lifetime of 1000 nit LT95S is improved when the hole injection energy-level barrier between HTL and HIL $\Delta E_{HTL\text{-}HIL}$<−0.2 eV, where the blue quantum dot devices of Examples 8 and 9 are compared, the red quantum dot devices of Example 10 and 11 are compared. It shows that the overall rate of hole injection in the QLED device is reduced and the number of holes entering the QLED device is effectively controlled by increasing the hole injection barrier from the anode to the HIL, which not only improves the carrier recombination efficiency, but also reduces the charge accumulation at the interface between HTL and HIL due to excessive injection of holes, and thus the luminous lifetime of the device is improved.

Examples 12-19

To verify the influence of the energy-level barrier at the interface from HIL to HTL on the device performance, Examples 12-19 are provided in the present application to illustrate the effect of the hole injection barrier $\Delta E_{HTL\text{-}HIL}$ on the driving voltage and other performances of the device through a comparison of different collocations of HTL and HTL.

In each of Examples 12-14 of the present application, a blue quantum dot whose shell is ZnS (an inner core is CdZnSe, an intermediate shell is ZnSe, the thickness of the outer shell is 0.3 nm, and the maximum energy level of the valence band is 6.5 eV) is adopted. In each of Examples 15 to 19, a red quantum dot whose outer shell is ZnS (an inner core is CdZnSe, an intermediate shell is ZnSe, the thickness of the outer shell is 0.3 nm, the maximum energy level of the valence band is 6.5 eV) is adopted. The hole transport materials are P9 ($E_{HOMO}$: 5.5 eV), P13 ($E_{HOMO}$: 4.9 eV), TFB ($E_{HOMO}$: 5.4 eV), respectively; the hole injection layers are made of PEDOT: PSS ($E_{HOMO}$: 5.1 eV), HIL1-1 (work function: 5.4 eV) and HIL1-2 (work function: 5.3 eV), respectively; and the electron transport layer is made of ZnO, as shown in Table 3 below:

TABLE 3

| Device No. | Outer Shell of Blue QD | Material of HIL | Material of HIL | $\Delta E_{HTL-HIL}$ (eV) | Voltage Increase (V) @16 H |
|---|---|---|---|---|---|
| Example 12 | ZnS (6.5 eV) | TFB (5.4 eV) | PEDOT: PSS (5.1 eV) | 0.3 | 0.7 |
| Example 13 | ZnS (6.5 eV) | P9 (5.1 eV) | PEDOT: PSS (5.1 eV) | 0 | 0.25 |
| Example 14 | ZnS (6.5 eV) | P13 (4.9 eV) | PEDOT: PSS (5.1 eV) | −0.2 | 0.4 |

| Device No. | Outer Shell of Red QD | Material of HIL | Material of HIL | $\Delta E_{HTL-HIL}$ (eV) | Voltage Increase (V) @20 H |
|---|---|---|---|---|---|
| Example 15 | ZnS (6.5 eV) | TFB (5.4 eV) | PEDOT: PSS (5.1 eV) | 0.3 | 1 |
| Example 16 | ZnS (6.5 eV) | P15 (5.8 eV) | PEDOT: PSS (5.1 eV) | 0.7 | 1.9 |
| Example 17 | ZnS (6.5 eV) | P15 (5.8 eV) | HIL2 (5.6 eV) | 0.2 | 0.3 |
| Example 18 | ZnS (6.5 eV) | TFB (5.4 eV) | HIL1-1 (5.4 eV) | 0 | −0.4 |
| Example 19 | ZnS (6.5 eV) | TFB (5.4 eV) | HIL1-2 (5.3 eV) | 0.1 | −0.4 |

Figure 19:
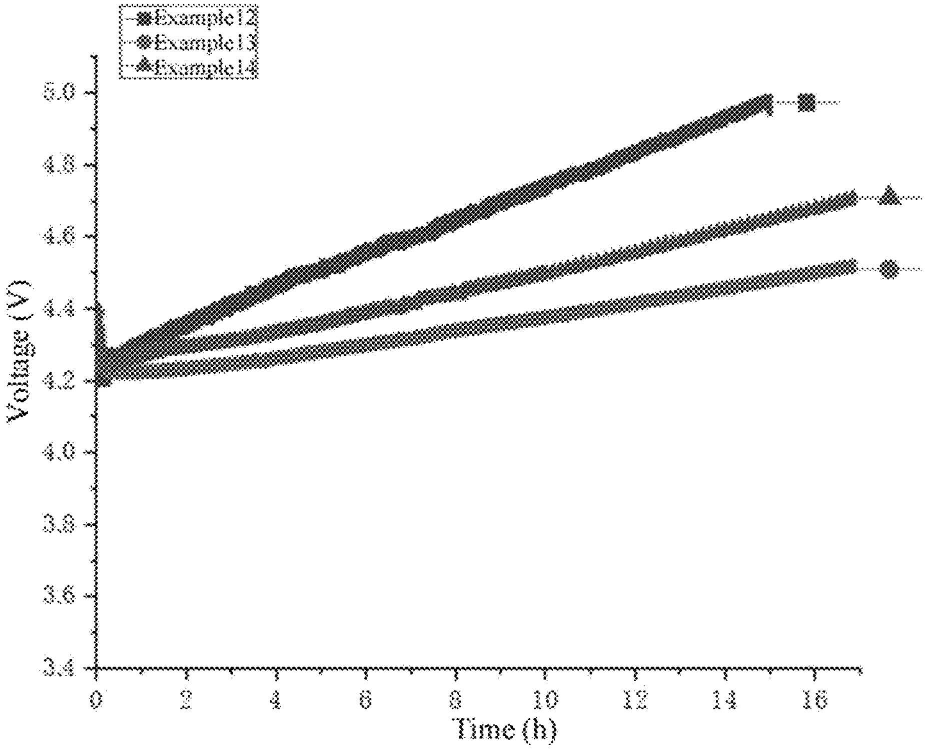
FIG. 19 is a graph showing a relationship between voltage and time of quantum dot light-emitting diodes provided in Examples 12 to 14 of the present application.
Figure 20:
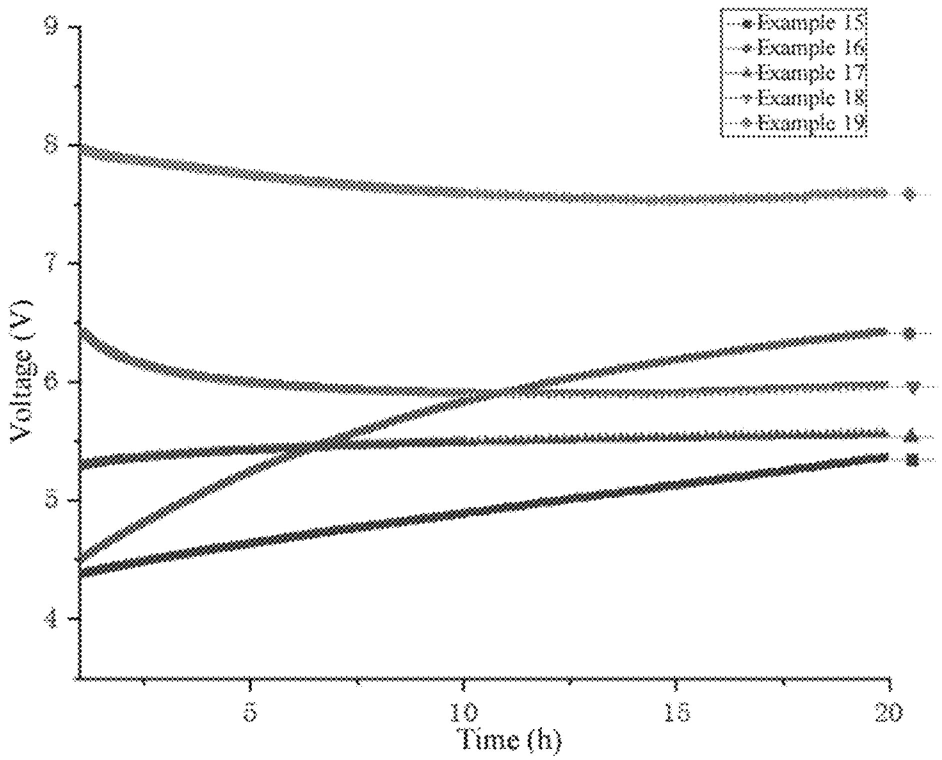
FIG. 20 is a graph showing a relationship between voltage and time of quantum dot light-emitting diodes provided in Examples 15-19 of the present application.

From the above test results of Table 3 and FIGS. 19 and 20 (the abscissa is time and the ordinate is voltage), it can be seen that, compared with the Examples where $|\Delta E_{HTL-HIL}|$ is greater than 0.2, the charge accumulation on the hole transport side of the device is very small, the driving voltage increase of the device is significantly reduced under long-term constant current operation of the device, and the device lifetime of 1000 nit LT95S is improved, when the hole injection energy-level barrier $|\Delta E_{HTL-HIL}|$ between HTL and HIL is smaller than or equal to 0.2 eV. At the same time, when the barrier difference between HIL and HTL is quite small, almost no charge is accumulated on the interface, no aging on the opposite side, the hole injection capability of the device is stable, and the device lifetime is also improved. It shows that a reduction of the energy-level barrier of hole injection is beneficial to the effective injection of holes from HIL to HTL, thereby the potential barrier and interface charges is eliminated, the overall resistance of the device is reduced, and thus the lifetime of the device is prolonged.

Examples 20-25

To verify the influence of the material of the hole transport layer on the performance of the device, Examples 20 to 25 are provided in the present application to illustrate the effect of the material of HTL on the construction of a hole injection barrier, the optimization of the carrier recombination efficiency and the lifetime and other performances of the device, through a comparison of different collocations of HTL materials.

In each of Examples 20 to 25 of the present application, a blue quantum dot whose outer shell is ZnS (an inner core is CdZnSe, an intermediate shell is ZnSe, the thickness of the outer shell is 0.3 nm, and the maximum energy level of the valence band is 6.5 eV) is adopted. The hole transport materials are respectively: P12 ($E_{HOMO}$: 5.8 eV), P13 ($E_{HOMO}$: 4.9 eV), TFB ($E_{HOMO}$: 5.4 eV), and the hole injection layer is made of PEDOT: PSS ($E_{HOMO}$: 5.1 eV), as shown in Table 4 below:

TABLE 4

| Device No. | Outer Shell of Blue QD | HTL | Hole Mobility of HTL | ETL | LT95 (h) |
|---|---|---|---|---|---|
| Example 20 | ZnS (6.5 eV) | P13 (4.9 eV) | 1.70E−03 | ZnO nanoparticles with surfaces being fully modified and passivated | 24.03 |
| Example 21 | | P13 (4.9 eV)<br>P09 (5.1 eV) | 1.70E−03<br>4.00E−03 | ZnO nanoparticles with surfaces being fully modified and passivated | 28.2 |
| Example 22 | | P13 (4.9 eV) 50%<br>TFB (5.4 eV) 50% | 1.70E−03<br>1.00E−03 | Conventional ZnO nanoparticles | 76.14 |
| Example 23 | | P12 (5.8 eV) | 3.00E−05 | ZnO nanoparticles with fewer group connections on the surface | 3.83 |
| Example 24 | | P13 (4.9 eV) 80%<br>P12 (5.8 eV) 20% | 1.70E−03<br>3.00E−05 | ZnO nanoparticles with fewer group connections on the surface | 85.77 |
| Example 25 | | P13 (4.9 eV) 40%<br>TFB (5.4 eV) 40%<br>P12 (5.8 eV) 20% | 1.70E−03<br>1.00E−03<br>3.00E−05 | Conventional ZnO nanoparticles | 64.6 |

Figure 21:
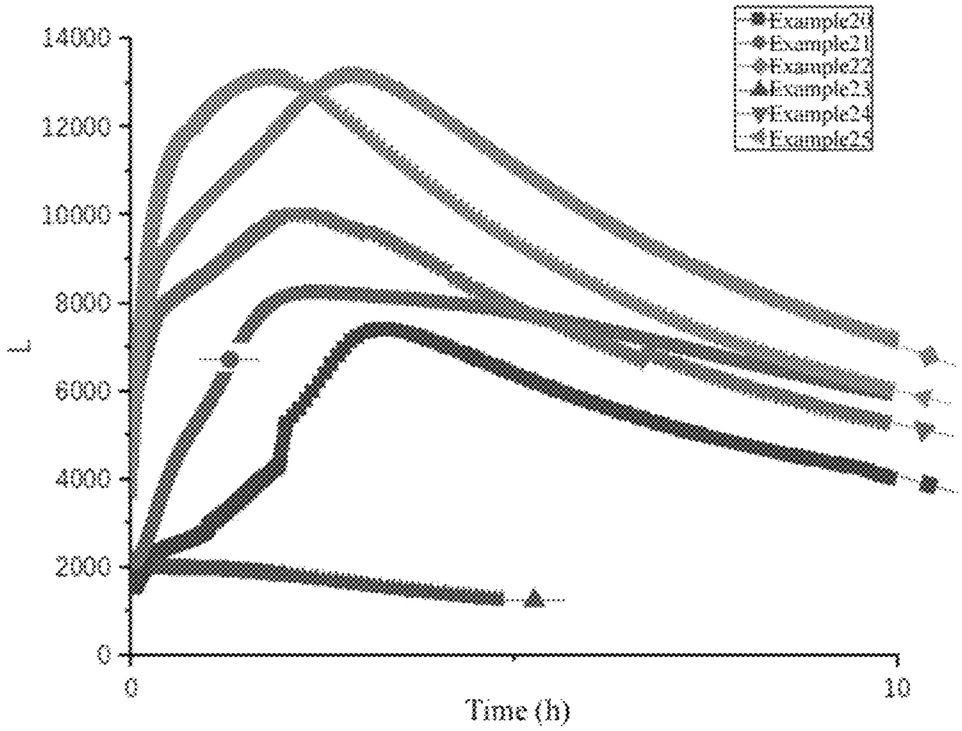
FIG. 21 is a graph showing test results of a luminous lifetime of quantum dot light-emitting diodes provided in Examples 20-25 of the present application.

From the test results of the above Table 4 and FIG. 21 (the abscissa is time and the ordinate is brightness), it can be seen that in the hole transport layer, materials having different energy levels can be mixed to enable a flexible regulation on an injection barrier of $\Delta E_{EML-HTL}$. the energy-level barrier $\Delta E_{EML-HTL}$ being greater than or equal to 0.5 eV is constructed to achieve the objectives of reducing the rate of hole injection in the QLED device, regulating the injection and recombination efficiency of carriers, and simultaneously reducing the irreversible damage caused by the charge accumulation at the HIL and HTL interface to the lifetime performance of the device. Moreover, the test results show that the device with the mixed hole transport layer has a better luminous lifetime. The deep energy level HTL can reduce the brightness change in the lifetime test caused by the exciton transport of HTL and QD, and reduce the rising period. Thus, through a mixing of the shallow energy level and the deep energy level, the rising period of the brightness of the device can be reduced while ensuring the device lifetime, and the device can quickly enter a stable state, which is beneficial to subsequent testing and application. With reference to the comparative Examples 22, 24 and 25 and FIG. 21, it can be seen that from Examples 22 to 24 to 25, the doping ratio of deep energy level materials increases, the lifetimes are all between 60-80 h, and the differences in lifetimes is small. The times of brightness increasing in the above tests are about 7 h, 5 h, and 4 h respectively. Compared with Example 21, Example 22, 24, or 25 has a higher proportion of deep-level materials, and the control range of the mobility of the hole transport material is larger. It is easier to obtain a quantum dot device having a longer lifetime.

Examples 26-28

In Examples 26-28, when the outer shell of the blue quantum dot material is ZnS (the inner core is CdZnSe, the intermediate shell is ZnSe, and the thickness of the outer shell is in a range of 0.2-2.0 nm), in order to construct a suitable $\Delta E_{EML-HTL}$ energy-level barrier, the absolute value of the maximum energy level of valence band of the hole transport material needs to be smaller than or equal to 6.0 eV, as shown in Examples 26-28 in Table 5 below (the hole injection layer is made of PEDOT: PSS ($E_{HOMO}$: 5.1 eV), and the electron transport layer is made of ZnO):

TABLE 5

| Device No. | Outer Shell of Blue QD | Material of HIL | Mobility of HTL | $\Delta E_{EML-HIL}$ (eV) | LT95 (h) |
|---|---|---|---|---|---|
| Example 26 | ZnS (6.5 eV) | P15 (5.8 eV) | 1.0E−4 | 0.7 | 6.29 |
| Example 27 | ZnS (6.5 eV) | P11 (5.5 eV) | 1.3E−3 | 1 | 11.82 |
| Example 28 | ZnS (6.5 eV) | P13 (4.9 eV) | 1.7E−3 | 1.6 | 31.2 |

Figure 22:
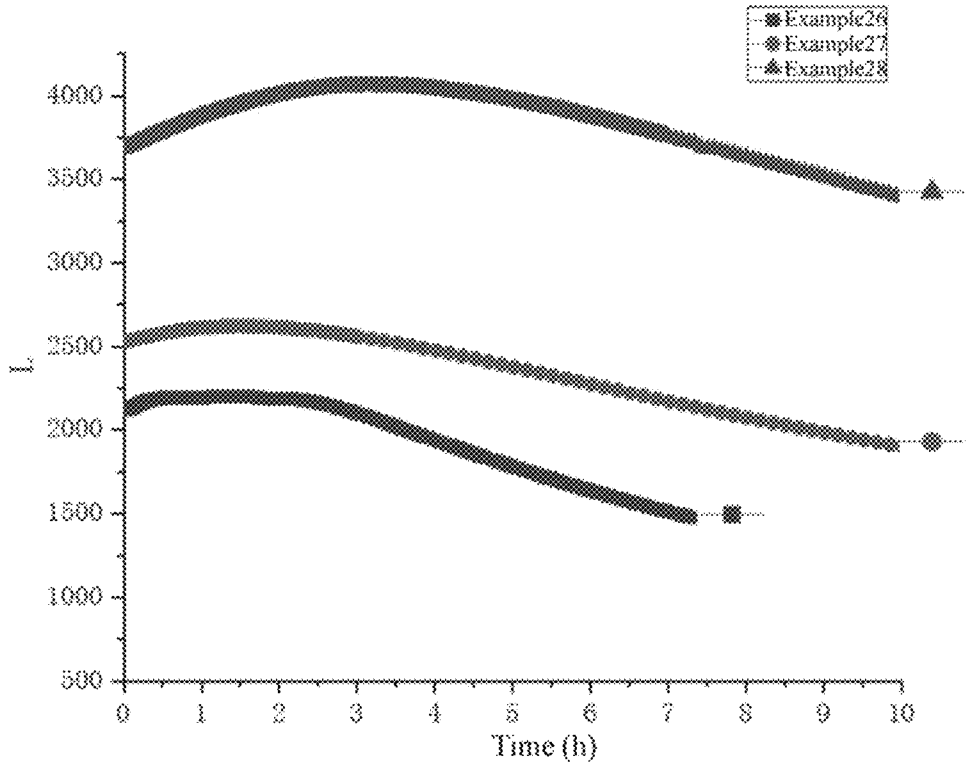
FIG. 22 is a graph showing test results of a luminous lifetime of quantum dot light-emitting diodes provided in Examples 26-28 of the present application.

From the test results of the above table 5 and FIG. 22 (the abscissa is time and the ordinate is brightness), it can be seen that when the outer shell of the quantum dot light-emitting layer material is ZnS and the thickness of the outer shell is in the range of 0.2-2.0 nanometers, the difference in maximum energy level of valence band ($\Delta E_{EML-HTL}$) between the hole transport layer material and the quantum dot shell material in the quantum dot light-emitting layer ranges from 1.0 eV to 1.6 eV, and the device has a better luminous lifetime at this time.

Examples 29-31

In Examples 29-31, when the outer shell of the blue quantum dot material is ZnSe (the inner core is CdZnSe, the intermediate shell is ZnSe, and the thickness of the outer shell is in a range of 2-5 nm, in order to construct a suitable $\Delta E_{EML-HTL}$ energy-level barrier, the absolute value of the maximum energy level of valence band of the hole transport material needs to be smaller than or equal to 5.4 eV, as shown in Examples 29-31 in Table 6 below (the hole injection layer is made of PEDOT: PSS ($E_{HOMO}$: 5.1 eV), and the electron transport layer is made of ZnO):

TABLE 6

| Device No. | Outer Shell of Blue QD | Material of HIL | Mobility of HTL | $\Delta E_{EML-HIL}$ (eV) | LT95 (h) |
|---|---|---|---|---|---|
| Example 29 | ZnSe (5.9 eV) | P11 (5.5 eV) | 1.3E−0.3 | 0.4 | 0.85 |
| Example 30 | ZnSe (5.9 eV) | TFB (5.4 eV) | 1.0E−0.3 | 0.5 | 7.81 |
| Example 31 | ZnSe (5.9 eV) | P13 (4.9 eV) | 1.7E−0.3 | 1.0 | 31.3 |

Figure 23:
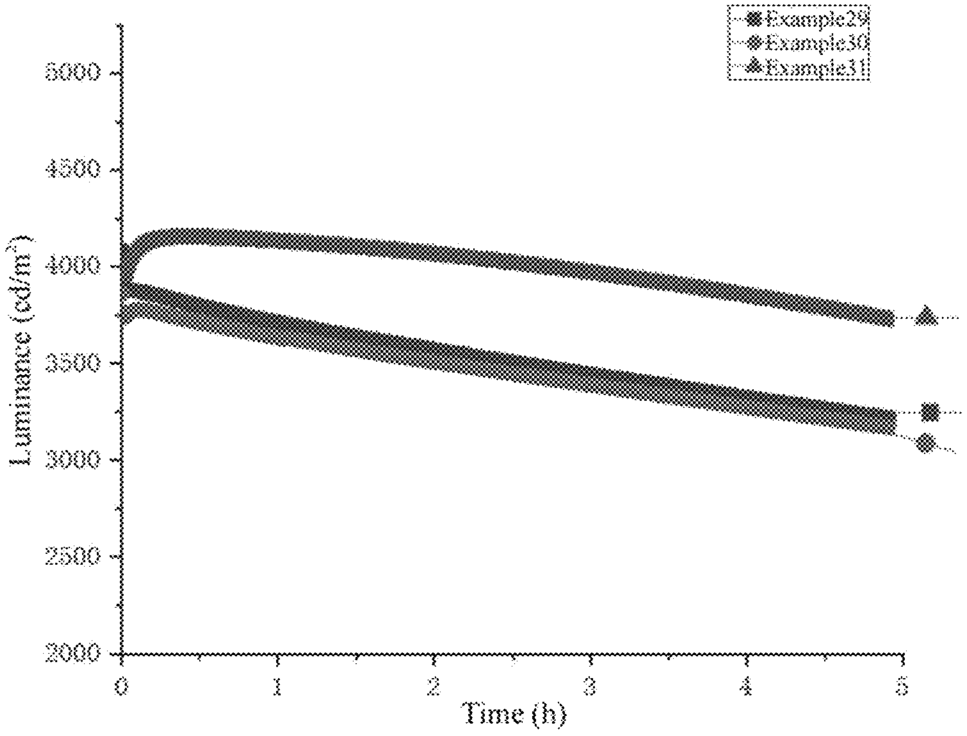
FIG. 23 is a graph showing test results of a luminous lifetime of quantum dot light-emitting diodes provided in Examples 29-31 of the present application.

From the test results of the above table 6 and FIG. 23 (the abscissa is time and the ordinate is brightness), it can be seen that when the outer shell of the quantum dot light-emitting layer material is ZnS, and the thickness of the outer shell is in the range of 2-5 nanometers, the difference in maximum energy level of valence band ($\Delta E_{EML-HTL}$) between the hole transport layer material and the quantum dot outer shell material in the quantum dot light-emitting layer ranges from 0.5 eV to 1.0 eV, and the device has a better luminous lifetime at this time.

Examples 32-35

In Examples 32 to 35, when the outer shell of the blue quantum dot material is CdZnS (the inner core is CdZnSe, the intermediate shell is ZnSe, and the thickness of the outer shell is in a range of 0.5-3.0 nm), in order to construct a suitable $\Delta E_{EML-HTL}$ energy-level barrier, the absolute value of the maximum energy level of valence band of the hole transport material needs to be smaller than or equal to 5.9 eV, as shown in Examples 32 to 35 in Table 7 below (the hole injection layer is made of PEDOT: PSS ($E_{HOMO}$: 5.1 eV), and the electron transport layer is made of ZnO):

TABLE 7

| Device No. | Outer Shell of Blue QD | Material of HIL | Mobility of HTL | $\Delta E_{EML-HIL}$ (eV) | LT95 (h) |
|---|---|---|---|---|---|
| Example 32 | CdZnS (6.3 eV) | P15 (5.8 eV) | 1.0E−04 | 0.5 | 0.72 |
| Example 33 | CdZnS (6.3 eV) | P9 (5.1 eV) | 4.0E−03 | 1.2 | 1.26 |
| Example 34 | CdZnS (6.3 eV) | P13 (4.9 eV) | 1.7E−03 | 1.4 | 7.72 |
| Example 35 | CdZnS (6.3 eV) | P11 (5.5 eV) | 1.3E−03 | 0.8 | 1.08 |

Figure 24:
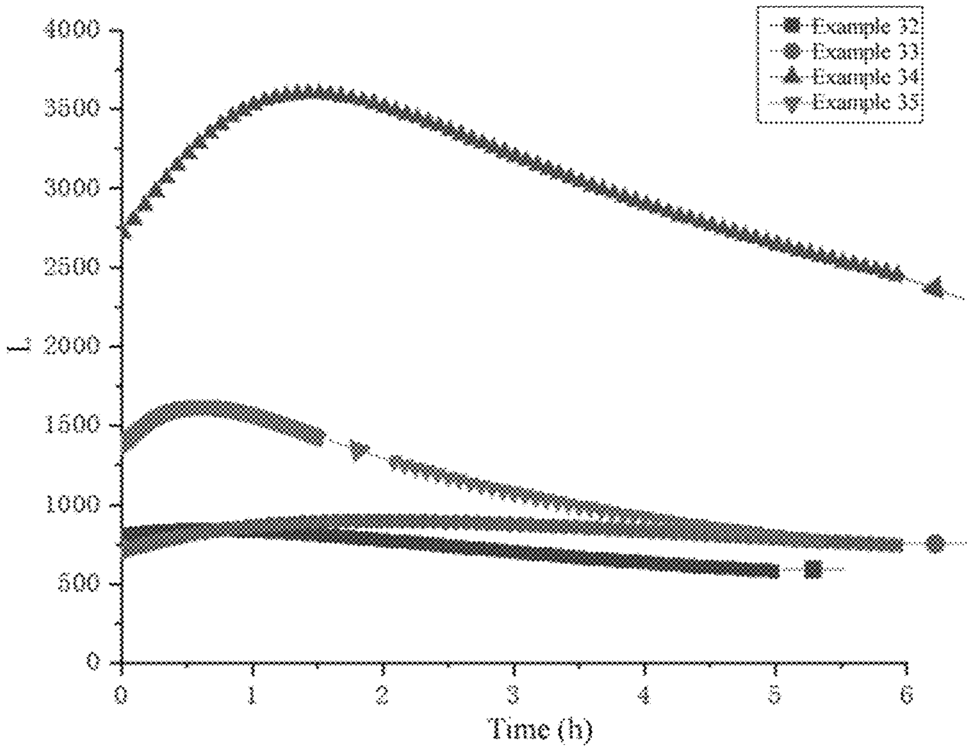
FIG. 24 is a graph showing test results of a luminous lifetime of quantum dot light-emitting diodes provided in Examples 32-35 of the present application.
Figure 25:
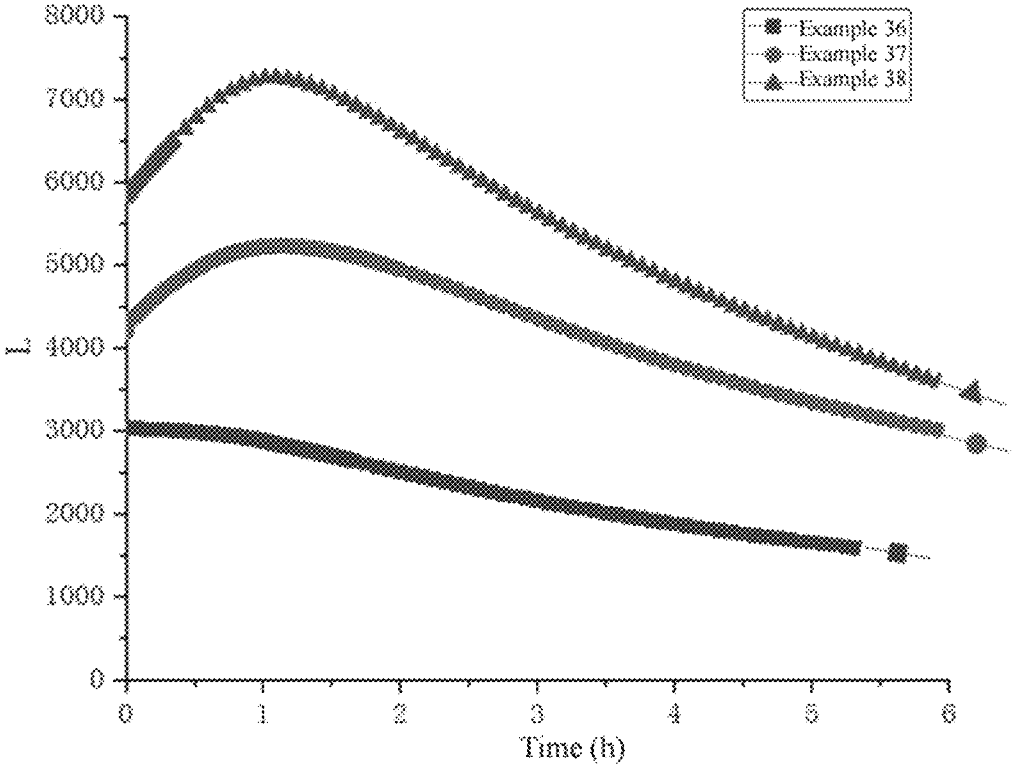
FIG. 25 is a graph showing test results of a luminous lifetime of quantum dot light-emitting diodes provided in Examples 36-38 of the present application.

From the test results of the above Table 7 and FIG. 24 (the abscissa is time and the ordinate is brightness), it can be seen that when the outer shell of the quantum dot light-emitting layer material is CdZnS, and the thickness of the outer shell is in the range of 0.5-3.0 nanometers, the difference in maximum energy level of valence band ($\Delta E_{EML-HTL}$) between the hole transport layer material and the quantum dot outer shell material in the quantum dot light-emitting layer is in a range of 0.8-1.4 eV, and the device has a better luminous lifetime at this time.

Examples 36-38

In Examples 36-38, when the outer shell of the blue quantum dot material is ZnSeS (the inner core is CdZnSe, the intermediate shell is ZnSe, and the thickness of the outer shell is in a range of 1.0-4.0 nm), in order to construct a suitable $\Delta E_{EML-HTL}$ energy-level barrier, the absolute value of the maximum energy level of valence band of the hole transport material needs to be smaller than or equal to 5.7 eV, as shown in Examples 36 to 38 in Table 8 below (the hole injection layer is made of PEDOT: PSS ($E_{HOMO}$: 5.1 eV), and the electron transport layer is made of ZnO):

TABLE 8

| Device No. | Outer Shell of Blue QD | Material of HIL | Mobility of HTL | $\Delta E_{EML-HIL}$ (eV) | LT95 (h) |
|---|---|---|---|---|---|
| Example 36 | ZnSeS | P15 (5.8 eV) | 1.0E−04 | 0.5 | 6.26 |
| Example 37 | (6.3 eV) | TFB (5.4 eV) | 1.0E−0.3 | 0.9 | 13.89 |
| Example 38 | | P13 (4.9 eV) | 1.7E−03 | 1.4 | 17.62 |

From the test results of the above table 8 and FIG. 24 (the abscissa is time and the ordinate is brightness), it can be seen that when the outer shell of the quantum dot light-emitting layer material is CdZnS, and the thickness of the outer shell is in the range of 1.0-4.0 nanometers, the difference in maximum energy level of valence band ($\Delta E_{EML-HTL}$) between the hole transport layer material and the quantum dot outer shell material in the quantum dot light-emitting layer is in a range of 0.9-1.4 eV, and the device has a better luminous lifetime at this time.

Examples 39-43

To verify the influence of the hole injection layer on the performance of the device, the present application provides the following examples. In each of Examples 39-41, a red quantum dot whose outer shell is ZnS (an inner core is CdZnSe, an intermediate shell is ZnSe, and the maximum energy level of the valence band is 6.5 eV) is adopted. In each of Examples 42-43, a red quantum dot whose outer shell is ZnS (an inner core is CdZnSe, an intermediate shell is ZnSe, and the maximum energy level of valence band is 6.5 eV) is adopted, and the electron transport layer is made of ZnO. As shown in Table 9:

TABLE 9

| Device No. | Outer Shell of Red QD | Material of HIL | Mobility of HIL Material | Material of HIL | T95 (h) | Voltage Increase (V) @40 H |
|---|---|---|---|---|---|---|
| Example 39 | ZnS (6.5 eV) | TFB (5.4 eV) | 1.00E−03 | PEDOT: PSS (5.1 eV) | 2000 | 1.5 |
| Example 40 | ZnS (6.5 eV) | TFB (5.4 eV) | 1.00E−03 | none | 162.5 | −0.3 |
| Example 41 | ZnS (6.5 eV) | P11 (5.5 eV) | 1.30E−03 | none | 1436 | −0.15 |

| Device No. | Outer Shell of Red QD | Material of HIL | Mobility of HIL Material | Material of HIL | T95 (h) | Voltage Increase (V) $L_{max}$ to L95 |
|---|---|---|---|---|---|---|
| Example 42 | ZnS (6.5 eV) | TFB (5.4 eV) | 1.00E−03 | $MoO_3$ | 2357 | −0.2 |
| Example 43 | ZnS (6.5 eV) | TFB (5.4 eV) | 1.00E−03 | PEDOT: PSS (5.1 eV) | 2000 | 0.8 |

Figure 26:
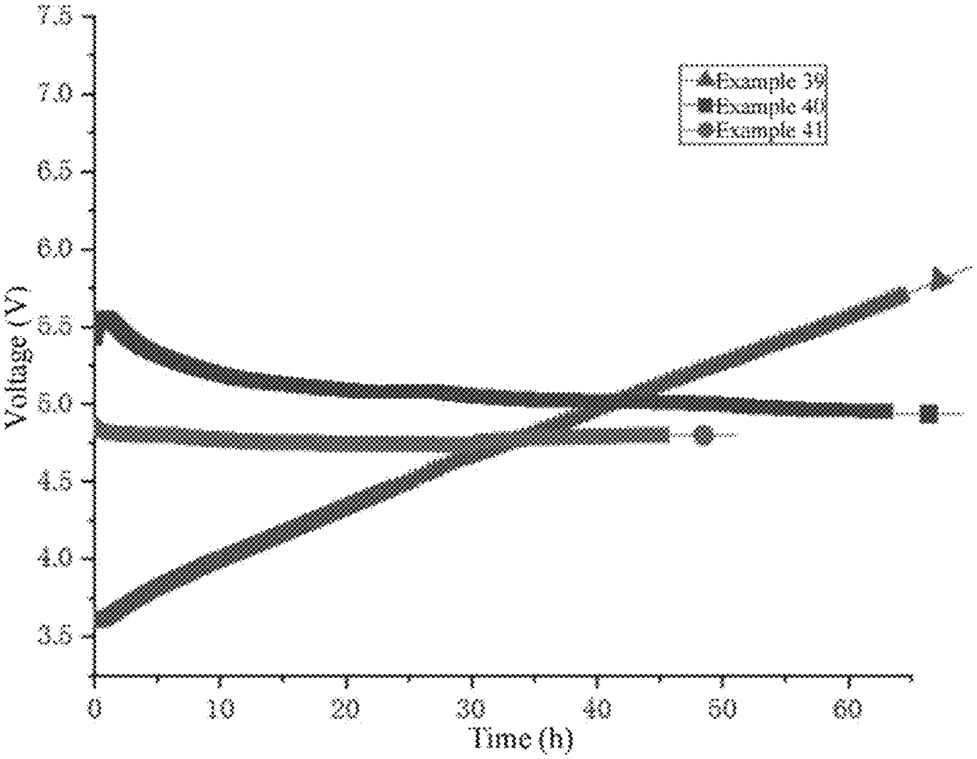
FIG. 26 is a graph showing a relationship between voltage and time of quantum dot light-emitting diodes provided in Examples 39-41 of the present application.
Figure 27:
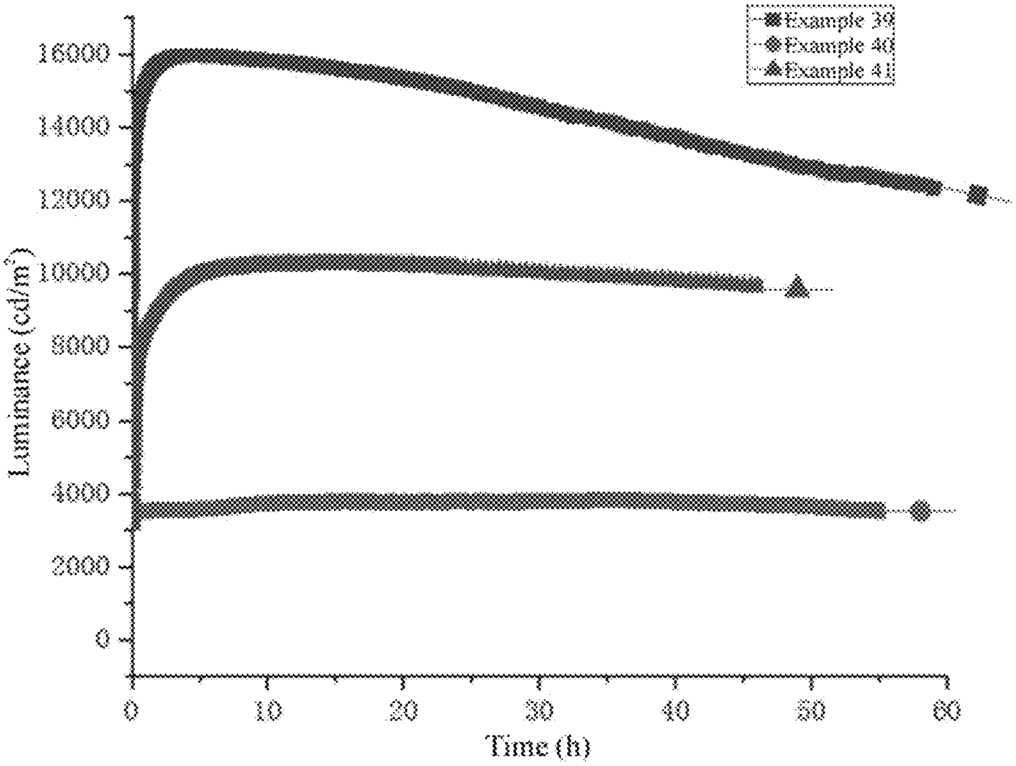
FIG. 27 is a graph showing test results of a luminous lifetime of quantum dot light-emitting diodes provided in Examples 39-41 of the present application.
Figure 28:
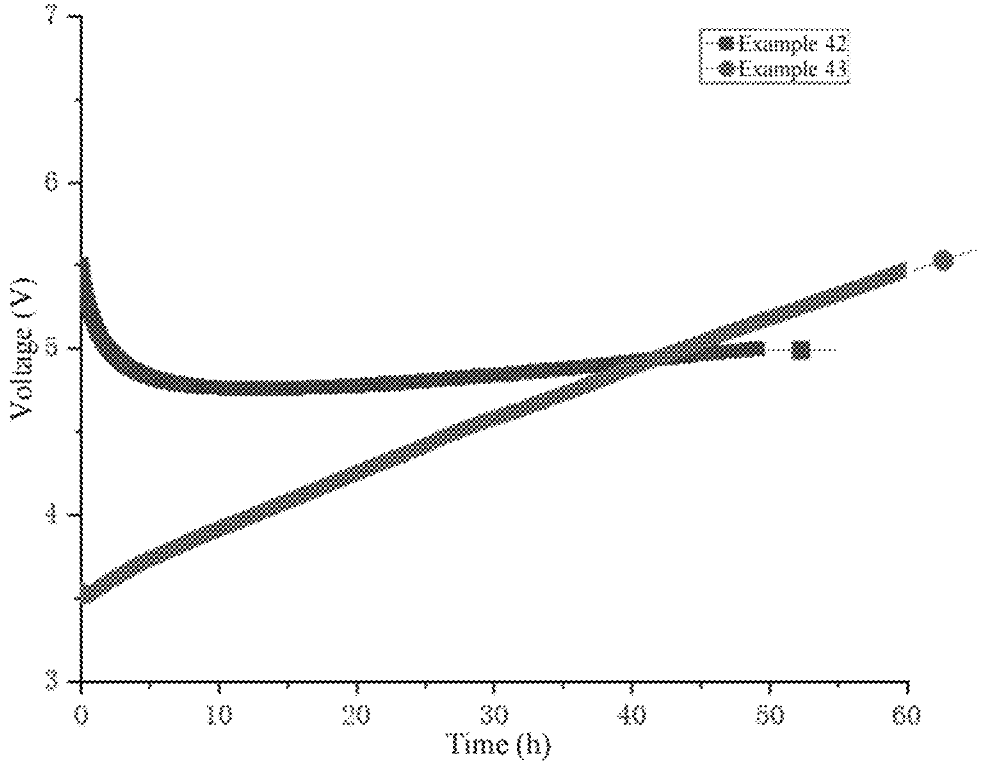
FIG. 28 is a graph showing a relationship between voltage and time of quantum dot light-emitting diodes provided in Examples 42-43 of the present application.
Figure 29:
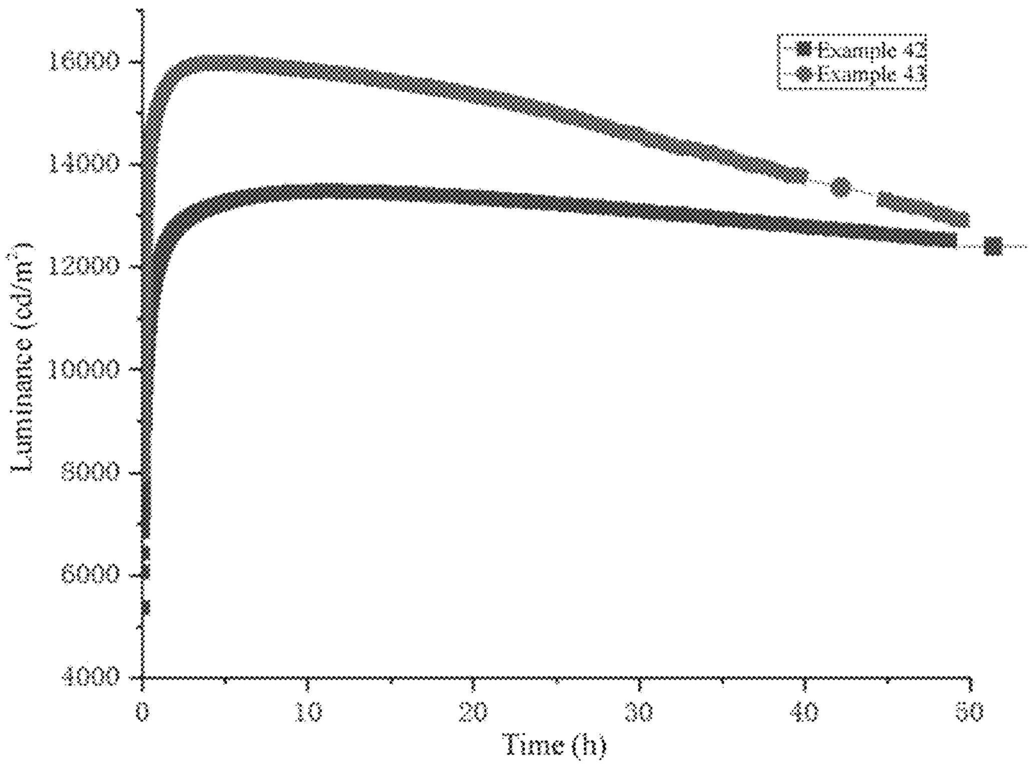
FIG. 29 is a graph showing test results of a luminous lifetime of quantum dot light-emitting diodes provided in Examples 42-43 of the present application.

From the test results of the above Table 9 and FIGS. 26 and 28 (the abscissa is time and the ordinate is voltage), and FIGS. 27 and 29 (the abscissa is time and the ordinate is brightness), it can be seen that when the HIL layer is removed from the device, The charge accumulation between the hole injection layer and the hole transport layer and the influence of acidic PEDOT on the device disappear, and the driving voltage of the device is almost unchanged under the long-term constant current operation of the device. The driving voltage of the device even tends to decrease due to that the defects in the device is filled with charges. Due to the using of P11 material having a higher mobility, the driving voltage of the device drops more significantly under long-term constant current operation after the HIL-free devices is prepared, which indicates that a better suppression effect for a voltage rise of the device can be obtained when the mobility of HTL is higher than 1×10−3 $cm^2$/Vs.

In addition, when the inorganic metal oxide $MoO_3$ is used instead of the organic PEDOT: PSS as the material of the hole injection layer, the damage of the $MoO_3$ hole injection material is effectively suppressed, so that the voltage rise of the device in the working process is significantly reduced compared with the device having organic hole injection layer material, and the measured duration of the device lifetime is also effectively improved.

The foregoing are only some optional embodiments of the present application, and are not intended to limit the present application. For those skilled in the art, various modifications and variations may occur in the present application. Any modifications, equivalent replacements, improvements, etc. made within the spirit and principles of the present application shall all be included within the protection scope of the claims of the present application.

What is claimed is:

1. A photoelectric device, comprising:

an anode, a first hole injection layer arranged on the anode, a hole transport layer arranged on the first hole injection layer, a quantum dot light-emitting layer arranged on a hole transport layer, and a cathode arranged on the quantum dot light-emitting layer, wherein the hole transport layer contains only a hole transport material and does not contain an electron transport material, and an absolute value of a difference between a maximum valence-band energy level of the hole transport material in the hole transport layer and a work function of a first hole injection material in the first hole injection layer is smaller than or equal to 0.2 eV, wherein the quantum dot light-emitting layer comprises a quantum dot material having a core-shell structure, and a difference in maximum valence-band energy level between an outer shell material of the quantum dot material and the hole transport material is in a range of 0.5 eV to 1.7 eV, and wherein the hole transport material comprises multiple hole transport materials having different maximum valence-band energy levels, and at least one of the multiple hole transport materials has a maximum valence-band energy level being smaller than or equal to 5.3 eV.

2. The photoelectric device according to claim 1, wherein the absolute value of the difference between the maximum valence-band energy level of the hole transport material and the work function of the first hole injection material is 0 eV.

3. The photoelectric device according to claim 1, wherein an absolute value of the work function of the first hole injection material is in a range of 5.3-5.6 eV.

4. The photoelectric device according to claim 1, wherein a mobility of the hole transport material is higher than $1\times10^4$ $cm^2$/Vs.

5. The photoelectric device according to claim 3, wherein the first hole injection material is a metal oxide material.

6. The photoelectric device according to claim 4, wherein the hole transport material comprises at least one of polymers containing aniline groups and copolymers containing fluorene groups and aniline groups.

7. The photoelectric device according to claim 5, wherein the metal oxide material comprises at least one of tungsten oxide, molybdenum oxide, vanadium oxide, nickel oxide, and copper oxide.

8. The photoelectric device according to claim 5, wherein a particle size of the metal oxide material is in a range of 2-10 nm.

9. The photoelectric device according to claim 6, wherein the polymers containing the aniline groups comprise at least one of poly-TPD, TFB, P9, P11, and P13.

10. The photoelectric device according to claim 6, wherein the copolymers containing the fluorene groups and the aniline groups comprise at least one of TFB, P13, and P15.

11. The photoelectric device according to claim 1, wherein the photoelectric device further comprises an electron transport layer.

12. The photoelectric device according to claim 11, wherein the quantum dot material is composed of at least one of semiconductor compounds of II-IV group, II-VI group, II-V group, III-V group, III-VI, group IV-VI group, I-III-VI group, II-IV-VI group, II-IV-V group in a periodic table of elements.

13. The photoelectric device according to claim 11, wherein the quantum dot material having the core-shell structure is composed of at least two of semiconductor compounds of II-IV group, II-VI group, II-V group, III-V group, III-VI, group IV-VI group, I-III-VI group, II-IV-VI group, II-IV-V group in a periodic table of elements.

14. The photoelectric device according to claim 11, wherein the electron transport material in the electron transport layer comprises at least one of a metal oxide compound transport material and an organic transport material.

15. The photoelectric device according to claim 14, wherein the metal oxide compound transport material comprises at least one of zinc oxide, titanium oxide, zinc sulfide, and cadmium sulfide.

16. The photoelectric device according to claim 14, wherein the metal oxide compound transport material comprises at least one of zinc oxide, titanium oxide, zinc sulfide, and cadmium sulfide, respectively doped with a metal element, and wherein the metal element comprises at least one of aluminum, magnesium, lithium, lanthanum, yttrium, manganese, gallium, iron, chromium, and cobalt.

17. The photoelectric device according to claim 14, wherein a particle size of the metal oxide compound transport material is smaller than or equal to 10 nm.

18. The photoelectric device according to claim 14, wherein the organic transport material comprises at least one of 8-hydroxyquinoline-lithium, octa-hydroxyquinoline aluminum, fullerene derivatives, 3,5-bis(4-tert-butylphenyl)-4-phenyl-4H-1,2,4-triazole, 1,3,5-tri (1-phenyl-1H-benzimidazole-2-yl)benzene.

19. The photoelectric device according to claim 1, wherein the first hole injection layer has a thickness of 10-150 nm; and/or the hole transport layer has a thickness of 10-150 nm.

* * * * *